US011201619B2

(12) United States Patent
Rinne et al.

(10) Patent No.: US 11,201,619 B2
(45) Date of Patent: Dec. 14, 2021

(54) ISOLATED HIGH SIDE DRIVE CIRCUIT

(71) Applicant: Heyday Integrated Circuits SAS, Grasse (FR)

(72) Inventors: Karl Rinne, Cork (IE); Joseph Duigan, Peymeinade (FR)

(73) Assignee: Heyday Integrated Circuits SAS, Grasse (FR)

( * ) Notice: Subject to any disclaimer, the term of this patent is extended or adjusted under 35 U.S.C. 154(b) by 0 days.

(21) Appl. No.: 16/483,570

(22) PCT Filed: Feb. 7, 2018

(86) PCT No.: PCT/EP2018/053104
§ 371 (c)(1),
(2) Date: Aug. 5, 2019

(87) PCT Pub. No.: WO2018/146161
PCT Pub. Date: Aug. 16, 2018

(65) Prior Publication Data
US 2020/0099376 A1    Mar. 26, 2020

(30) Foreign Application Priority Data

Feb. 7, 2017    (GB) ..................... 1702020

(51) Int. Cl.
*H03K 17/691*    (2006.01)
*H03K 17/06*    (2006.01)
(Continued)

(52) U.S. Cl.
CPC ............ *H03K 17/691* (2013.01); *H02M 1/08* (2013.01); *H03K 17/063* (2013.01); *H03K 17/6877* (2013.01); *H03K 2217/0045* (2013.01)

(58) Field of Classification Search
CPC ........ H02M 1/08; H02M 1/081; H02M 1/082; H02M 1/083; H02M 1/084; H02M 1/0845;
(Continued)

(56) References Cited

U.S. PATENT DOCUMENTS 5,028,814 A * 7/1991 Sung ...................... H03K 3/021
                                                                327/203
5,786,687 A * 7/1998 Faulk .................... H02M 3/155
                                                                323/289
(Continued)

FOREIGN PATENT DOCUMENTS

GB          2341288 A       3/2000

OTHER PUBLICATIONS

"PCT Search Report/Written Opinion for related PCT/EP2018/053104 application, dated Apr. 29, 2018, 10 pages."

*Primary Examiner* — Patrick C Chen
(74) *Attorney, Agent, or Firm* — Charles A. Lemaire; Jonathan M. Rixen; Lemaire Patent Law Firm, P.L.L.C.

(57) ABSTRACT

The present application relates to an isolated drive circuit, of the type commonly employed as high side drivers, for providing a drive signal to a semiconductor switch. The isolated drive circuit comprises a transformer with primary and secondary windings. The circuit further comprises a primary side circuit having a plurality of switches arranged in a bridge configuration with the primary winding positioned across the output of the bridge and a secondary side circuit connected to the secondary winding of the transformer and having a drive circuit output for providing a drive signal to the semiconductor switch. The advantage of this approach is that the entire circuit can be constructed as a module for use as a single component on a circuit board without requiring additional external components.

13 Claims, 17 Drawing Sheets

(51) Int. Cl.
*H03K 17/687* (2006.01)
*H02M 1/08* (2006.01)

(58) Field of Classification Search
CPC ...... H02M 1/088; H02M 1/092; H02M 1/096; H03K 17/063; H03K 17/6877; H03K 2217/0045
See application file for complete search history.

(56) References Cited

U.S. PATENT DOCUMENTS

| | | | |
|---|---|---|---|
| 6,107,860 | A | 8/2000 | Vinciarelli |
| 6,496,047 | B1 * | 12/2002 | Iskander .............. H03K 17/102 327/109 |
| 8,680,837 | B2 | 3/2014 | Zeng et al. |
| 8,816,666 | B2 | 8/2014 | Kimura |
| 2005/0036338 | A1 * | 2/2005 | Porter ................... H02M 3/335 363/21.01 |
| 2012/0206171 | A1 * | 8/2012 | Kimura ................ H03K 17/691 327/109 |
| 2015/0102952 | A1 * | 4/2015 | Yang ...................... H03K 3/012 341/161 |
| 2018/0019747 | A1 * | 1/2018 | Ikegawa .............. H03K 17/168 |
| 2018/0241391 | A1 * | 8/2018 | Chandrasekaran ... H03F 3/2171 |

\* cited by examiner

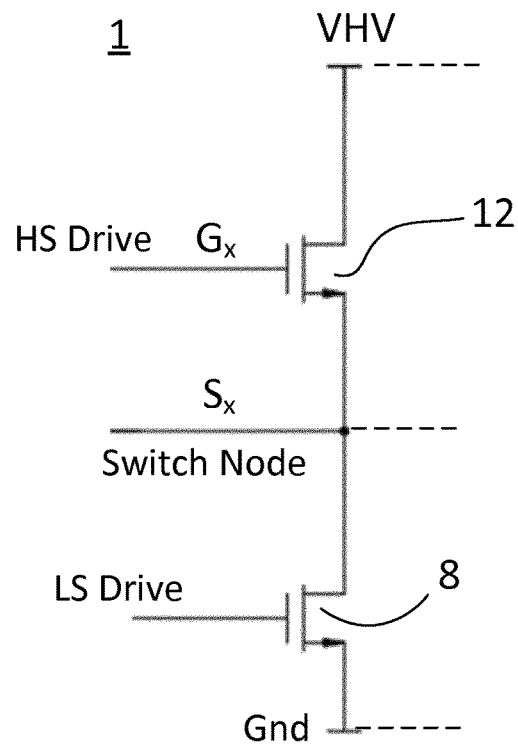
Prior Art    Fig. 1
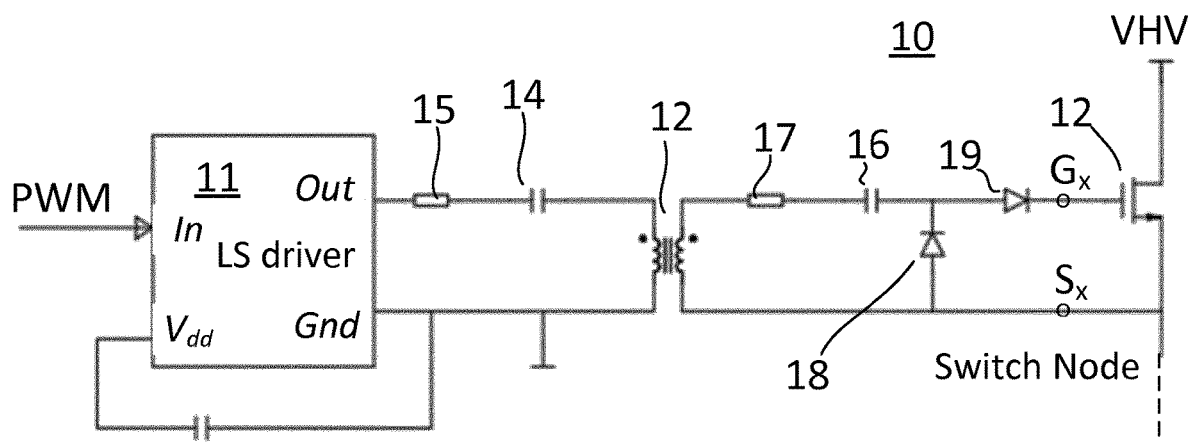
Prior Art    Fig. 2

| Q1 | Q2 | Q3 | Q4 | Q5 | State name | State # |
|----|----|----|----|----|------------|---------|
| 1 | 0 | 1 | 0 | x | Rest | 1 |
| 0 | 1 | 0 | 1 | x | Rest | 2 |
| 1 | 0 | 0 | 1 | 1 | High-E S:ON | 3 |
| 0 | 1 | 1 | 0 | 1 | T reset, S:OFF | 4 |
| 1 | 0 | 0 | 1 | 0 | Trickle | 5 |
| 0 | 1 | 1 | 0 | 0 | Trickle' | 6 |

Fig. 10

ISOLATED HIGH SIDE DRIVE CIRCUIT

CROSS-REFERENCE TO RELATED APPLICATIONS

This application is a national-phase filing of, and claims priority benefit of, PCT Patent Application No. PCT/EP2018/053104, filed Feb. 7, 2018 by Karl Rinne et al. and titled "An isolated high side drive circuit," which claims priority benefit of Great Britain Patent Application No. GB 1702020.7, filed Feb. 7, 2017 by Karl Rinne et al. and titled "An isolated high side drive circuit," each of which is incorporated herein by reference in its entirety.

FIELD OF THE APPLICATION

The present application relates to electronics and in particular to drive circuit s and more particularly to isolated drive circuits of the type commonly employed as high side drive circuits.

BACKGROUND

In the field of power electronics, drive circuits, commonly referred to as drivers, are used to turn switches on and off. Typically, these switches are part of a power train where they are used to switch energy through a circuit, for example in a power conversion system. In a power conversion system, when a switch is on (a period referred to as the "on time" for a switch), current is transferred through the switch to the components of the system. When the switch is off (a period referred to as off time) no current is passed. The switch or switches are coupled with other components (e.g. inductors, capacitors, transformers) to make up a power system.

Examples of switches are metal oxide semiconductor field effect transistors (MOSFETs), bipolar junction transistors (BJTs), insulated gate bipolar transistors (IGBTs), Gallium Nitride switches and Silicon Carbide switches. Regardless of the type of switch employed, a drive signal is required to turn the switch on or off. It will be appreciated by those skilled in the art, that different types of switch have different drive signal requirements. Thus for example MOSFETs may be considered to present a capacitive load, BJTs present a PN junction type load. A requirement of a drive circuit is to work with the type of load presented by the switch.

There are a number of constraints when it comes to designing or selecting a drive circuit. On the one hand, drive circuits must be capable of providing a sufficient drive current and voltage to turn on and off a switch. At the same time, the cost of manufacturing drive circuits increases along with their power consumption as drive currents and voltages increase meaning that there is a disadvantage to providing a drive circuit which is capable of providing significantly more than the required drive current or voltage for a given switch.

A further constraint on the choice of drive circuit is the position of the switch to be driven within the circuit of the power conversion system. A switch that has its reference node connected to ground is typically referred to as a low-side (LS) switch. A switch that has its reference node connected to a non-grounded node is typically referred to as a high-side switch. Similarly, a drive circuit that is employed driving a low-side switch is referred to a low-side (LS) drive circuit and a drive circuit that is used to drive a high-side switch is referred to a high-side (HS) drive circuit. It will be appreciated that a drive circuit that is suitable for use as a high-side switch may also be used as a low-side switch but the reverse is not necessarily true.

A simple arrangement 1 illustrating the difference between a High Side Switch 12 and a Low Side Switch 8 is shown in the switching circuit of FIG. 1 in which the switches are MOSFETs. The remaining part of such a switching circuit 1 is omitted with connections merely shown in dashed outline The drain of the high side switch is connected to a very high voltage VHV, with the source of the low side switch connected to ground. The source of the high side switch is connected to the drain of the low side switch at a point which may be referred to as the switch node for the high side switch. It will be appreciated that the gate of the low side switch will only require a switching voltage a few volts above ground to turn on the low side switch. In contrast, whilst only a few volts will be required between the nodes $S_x$ and $G_x$ to turn on the high side switch 12, the voltage at node $S_x$ may be a voltage anywhere between GND and VHV depending on the circuit conditions. Accordingly, a high side driver whilst only being required to produce a few volts to turn on a switch must do so in conditions where the voltage of the switching node to which it is connected may be at a very high voltage relative to ground.

The present application is directed generally at providing a drive circuit that may be employed as a high-side drive circuit that may be, at least partially, implemented in an integrated circuit (IC).

One approach to implementing a HS drive circuit is to employ a LS drive circuit in combination with a transformer. In such an arrangement, the output drive signal from a LS drive circuit is connected to a primary winding, with the drive signal passing through by the magnetic coupling of the transformer to a secondary winding which provides the drive signal to the high-side switch to be driven as shown generally in the exemplary circuit of FIG. 1.

The high side switch is connected at one terminal to a very high voltage (VHV). It will be appreciated that in the context of integrated circuits where operating voltages are typically less than 5 volts, very high voltage is a term that may be taken to be relatively low (compared to other applications). However, for the avoidance of doubt a VHV may be taken generally to mean a voltage of 50 volts are more. Typically, where the application is a mains operated switching circuit, the VHV will be greater than 100 Volts.

The arrangement 10 of FIG. 2 employs a low-side drive circuit 11 to transfer a pulse width modulated (PWM) signal through an isolation circuit, including a transformer 12, to turn on a high side power switch. The primary winding is typically capacitively coupled (for example by capacitor 14) to the output of the drive circuit to allow for the use of a unipolar drive signal. A resistor 15 may be inserted in the path to the primary winding to limit current.

On the secondary side, the secondary winding is also typically capacitively coupled (for example by capacitor 16), with a diode arrangement ensuring the polarity of pulses presented to the switching nodes $G_x$, $S_x$ of the switch. Similarly, a current limiting resistor 17 may be employed in the path to the switching nodes from the secondary winding.

It will be appreciated that this approach requires several external components in addition to the transformer to implement the HS drive circuit functionality, including for example the capacitors, diodes and resistors shown. It will be appreciated that FIG. 2 is merely an exemplary circuit and different circuits are known which omit or add components not shown.

It will be appreciated that there is a general desire in electronics to produce smaller circuitry and to lower costs.

At the same time, there is a general desire in switching power supplies to be more efficient. The arrangement of FIG. 2 presents a number of obstacles to these desires.

For example, the implementation of FIG. 2 consumes a lot of board area and is costly due to the use of extra external components. At the same time, there are energy losses in the transformer core and windings. Additionally, the use of a transformer core imposes limitations on the minimum operating frequency and maximum operating frequency of the drive circuit.

A different approach, which avoids the need for a transformer is to implement the HS drive circuits within an integrated circuit (IC) 21 for example as shown in the arrangement 20 of FIG. 3. In this arrangement 20, the PWM drive signal from the HS drive circuit is delivered through the IC directly to the HS power switch. Such ICs are conventionally implemented using high voltage (HV) process foundry nodes. A number of external components are also required, e.g. diodes and capacitors. The external components are used to provide a bootstrap function. In such an arrangement, the external capacitor 23 (referred to as the boot capacitor) is referenced to the switching node of the power switch circuit. An associated bootstrap diode 25 connects the supply voltage of the IC to the boot capacitor. This combination allows for the HS voltage to be delivered from HS drive circuit IC directly onto the gate of the HS power switch. As with the first arrangement, a current limiting resistor 24 may be employed.

IC based HS drive circuit implementations, such as that shown in FIG. 3, have several drawbacks. For example, they require bootstrap components, i.e. HV bootstrap diode and capacitor. For the bootstrap structure to operate correctly the switch node needs to fall to ground to charge the bootstrap capacitor appropriately for the next switching cycle. This does not occur naturally in all topologies which is a limitation. In some switching circuit topologies the switch node switches between two or more levels but, in operation, never actually falls to ground meaning a bootstrap structure is not suitable.

Other disadvantages include the requirement for internal floating HV wells in the IC which consume power and often introduce limitations to the drive circuit performance. Such limitations include restrictions on negative voltage excursions on the switching node, which are common undesired events in power switching stages. Other limitations are voltage dv/dt restrictions on the switching nodes, long propagation delays, increased power consumption and slow wake up times from sleep modes. Additionally, the silicon structures required necessitate employing high voltage foundry process nodes, mean the IC's are expensive to produce. The IC's employed tend to be limited in upper frequency of operation to typically a few hundreds of kHz.

Another exemplary approach is discussed in U.S. Pat. No. 6,107,860. This approach suffers from a number of disadvantages including that if the primary and secondary sides become asynchronous, the method stops working. As a result, for a design employing this approach significant attention is required to safeguarding to ensure this does not happen in order to maintain a robust synchronization scheme.

Another approach is outlined in GB2341288, which employs a centre tapped secondary winding effectively creating two secondary windings sharing a common ground reference.

The present application aims to address some of the problems of the prior art.

SUMMARY

The present application generally provides an isolated high side drive circuit having a primary side circuit provided electrically on one side of a transformer with a secondary side circuit provided electrically on the other side of the transformer. Both the first and secondary side windings of the transformer are suitably single windings (i.e. a winding with one or more turns between a first node and a second node with no intermediate point of connection). This combination is set forth in the claims which follow. It will be appreciated from the description which follows that the application is not intended to exclusively be so restricted and the application extends to a primary side circuit or secondary side circuit in isolation.

In this context, a number of embodiments are set forth below, which may be used in isolation or in any combination thereof.

A first embodiment provides a drive circuit for providing a drive signal through a transformer, wherein the drive circuit is configured to provide pulses of opposite polarity to a primary winding of the transformer, wherein a first polarity of pulse is intended to effect turning on of a switch on the secondary side of the transformer and a second polarity of pulse is intended to effect turning of the switch, characterised in that in a start-up mode the drive circuit is configured to provide a plurality of pulses of the second polarity prior to sending a first pulse of the first polarity.

A second embodiment provides a drive circuit receiving pulses of a first polarity and a second polarity from a transformer winding (or from an input of the drive circuit), the drive circuit being configured to turn on a switch in response to a pulse of first polarity and to turn off the switch in response to a pulse of the second polarity and where the drive circuit has an internal power rail powered by pulses of the first polarity, characterised in that the drive circuit further comprising a charge pump circuit for powering the internal power rail using pulses of the second polarity. It will be appreciated that the second embodiment may co-operate with the first embodiment to advantage.

The charge pump circuit is suitably configured to convert a pulse of the first polarity to a voltage of the second polarity. The charge pump circuit may comprise a first capacitor connected at a first plate to an input from a first side of the transformer winding, a diode connected between the second side of the transformer winding and a second plate of the first capacitor, the output provided from the second plate of the first capacitor through a third diode to the internal power rail.

A third embodiment provides a drive circuit for receiving control pulses of a first polarity and a second polarity, from a transformer winding, the drive circuit being configured to turn on a switch in response to a pulse of first polarity and to turn off the switch in response to a pulse of the second polarity and where the drive circuit has an internal power rail powered by received pulses of one or both polarities, the drive circuit comprising a memory circuit for storing the polarity of a last received pulse after the voltage on the power rail has collapsed. The memory circuit suitably comprises a self-biased flip flop.

The self-biased flip flop comprises first and second switches, each switch being connected to respective first and second capacitors for holding the polarity of the last received pulse. A first diode may be connected between the power rail and the first switch. In which case, a second diode is connected between the input of the drive circuit and the second switch. Suitably, the first and second switches are MOSFETs and the drain of the first MOSFET switch is connected to the gate of the second switch and wherein the drain of the second MOSFET switch is connected to the gate of the first MOSFET switch. In this case, each of the first and second capacitors is connected between drain and source of the respective first and second MOSFET switches. The drive circuit may further comprise a third switch connected to the output of the memory circuit, wherein the third switch is operable to switchable connected to the outputs of the drive circuit.

In a fourth embodiment, a drive circuit is provided responsive to pulses received from a transformer winding with a pulse of a first polarity representing a signal to cause the drive circuit to turn on a switch and a pulse of a second polarity representing a signal to cause the drive circuit to turn off the switch, wherein the drive circuit has a bias power supply providing a unipolar supply, characterised in that the drive circuit comprises a decision circuit for detecting a pulse of the second polarity, the decision circuit receiving an input from the transformer winding through a capacitor, the decision circuit comprising a comparator having an input node connected to the capacitor for receiving the input wherein the input node is DC biased at a point between approximately half the supply voltage and gnd in the absence of a pulse. In this arrangement of the drive circuit, the input node may be biased at a point between 40-60% of Vsec.

The drive circuit may further comprise a second capacitor connected between the internal power rail and the input node. In which case, the first and second capacitors may be selected to have approximately the same capacitance. First and second resistors may be provided with the first resistor connected between the internal power rail and the input node and the second resistor connected between the ground and the input node. Suitably, the first and second resistors are selected to have approximately the same value. In a fifth embodiment, a drive circuit is provided for providing a drive signal to a switch. The drive circuit comprises a ground referenced drive providing a ground referenced drive signal in response to an input pulse width modulated signal; a capacitor for coupling the ground referenced drive signal to the gate of the switch; and a bias adjusting mechanism for adjusting a bias voltage at the gate as a width of the input PWM signal varies.

In a sixth embodiment, an isolated drive circuit is provided for delivering a drive signal to a semiconductor switch. The isolated drive circuit comprises a transformer having a primary winding and a secondary winding; a primary side circuit having a plurality of switches arranged in a bridge configuration with the primary winding positioned across the output of the bridge; a secondary side circuit connected to the secondary winding of the transformer and having a drive circuit output for providing a drive signal to the semiconductor switch. Suitably, the secondary side circuit comprises a rectifier connecting one side of the secondary winding to the drive circuit output. The drive circuit output is suitably provided across two terminals.

The secondary side circuit may further comprise a level detector for detecting the voltage across the secondary winding. In which case, the secondary side circuit may further comprise a discharge switch provided across the two terminals, wherein the level detector is configured upon detecting that the voltage on the secondary winding has dropped below a predefined voltage is configured to close the discharge switch.

In all of the arrangements disclosed for drive circuits in this application, the isolated drive circuit only requires a single transformer.

In a seventh embodiment, an isolated high side drive circuit is provided for driving a high side switch which is provided as a single electronic component having connections for mounting on a circuit board, the drive circuit comprising:

a transformer having a primary winding and a secondary winding;

a low side circuit receiving a drive signal in response to which the low side circuit provides a control signal to the primary winding of the transformer;

a high side circuit connected to the secondary winding of the transformer and being configured to respond to the transformed control signal and to provide a drive signal to the to the high side switch.

The low side circuit suitably comprises an integrated circuit, preferably the low side circuit is solely implemented by the integrated circuit.

Equally, the high side circuit may comprise an integrated circuit, preferably the high side circuit is solely implemented by the integrated circuit.

The low side circuit function may be solely implemented by an integrated circuit and the high side circuit may be solely implemented by a further integrated circuit. In which case, the two integrated circuits may be embedded in a substrate having the transformer provided thereon and where electrical connections between the transformer and integrated circuits are provided using conductive tracks and vias formed in the substrate.

In an eighth embodiment, a circuit is provided a drive signal from a transformer winding to a high side semiconductor switch, the circuit providing an output to the switch across two nodes, the circuit providing a connection from a first end of the transformer winding through a rectifier to a first node of the two nodes, and where the second end of the transformer winding is connected to a second node of the two nodes; wherein the rectifier is arranged to provide a voltage to the first node when the winding voltage is positive; a discharge switch positioned between the two nodes, the discharge switch having a first state in which the two nodes are not connected through the switch and a second state in which the two nodes are connected through the switch; a comparator responsive to the winding voltage, the comparator being configured to provide a discharge signal to cause the discharge switch to change from the first state to the second state upon detecting when the winding voltage has fallen below a predetermined level.

The circuit may further comprise a power supply for the comparator, wherein the power supply comprises a capacitor which is charged by a positive voltage from the transformer winding. The circuit may be an integrated circuit. Suitably, the circuit is configured to be connected to only one winding having only two outputs.

In a ninth embodiment, a drive circuit is provided responsive to a PWM signal. The drive circuit is configured to provide a drive signal output to a primary winding of a transformer, wherein the drive circuit comprises: a switching circuit comprising a plurality of switches of which at least four are arranged in a full bridge, the switching circuit being configured to operate in a plurality of modes, wherein in a first mode the plurality of switches are switched to cause a positive drive voltage as the drive signal output, in a second mode the plurality of switches are switched to present a negative drive voltage as the drive signal output, and in a third mode no voltage is presented from the drive signal output a control circuit for controlling the plurality of switches to select a mode of operation from the plurality of modes, wherein the control circuit comprises a detector for detecting the arrival of a PWM (ON) pulse at the PWM input, wherein the control circuit is configured to select the first mode of operation for a predetermined period and thereafter to select the third mode. The predetermined period is suitably shorter than the expected duration of the PWM pulse. The control circuit is suitably configured to detect the end of the PWM pulse and in response thereto to select the second mode. The switching circuit may comprise a fourth mode in which a positive trickle voltage is presented as the drive signal output, where the trickle voltage is less than the positive drive voltages but greater than zero. The control circuit may be configured to select the fourth mode after the arrival of a PWM pulse and after the selection of the third mode but before the end of the PWM pulse. There may also be a fifth mode wherein in the fifth mode, a negative trickle voltage is presented as the drive signal output.

These and other aspects of the application will become apparent from the drawings and description which follows.

DESCRIPTION OF DRAWINGS

The present application will now be described with reference to the attached drawings in which:

FIG. 1 is an illustration of the difference between a high side and a low side switch;

FIG. 2 is an example of a known approach to providing a high side drive circuit using a low side drive circuit to pass a drive signal through a transformer to control a high side switch;

FIG. 10 is a truth table describing operating modes using the four switch full-bridge structure of FIG. 9;

DETAILED DESCRIPTION

The present application is directed at providing a high side drive circuit which addresses, at least, some of the problems of the prior art.

More specifically, the drive circuit of the present application provides an arrangement that allows for the delivery of relatively short control pulses across a transformer to drive a high side switch. The use of a transformer isolates a primary side of the drive circuit from a secondary side of the drive circuit. When employed in a circuit, the primary side is operated at voltages close to ground (and thus is relatively speaking low side). In contrast, the secondary side may be driving a high side switch and thus may be at a fluctuating high voltage relative to ground. It will be understood therefore, that a first part of the drive circuit may thus be referred to either as the low side driver or as the primary side circuit with a second part operating on the secondary side of the transformer referred to as a high side drive circuit or secondary side circuit. As will be explained below, each of these two circuits may be implemented in respective first and second integrated circuits.

In this arrangement, a first polarity of pulse (positive) is employed to turn on a switch connected to the output of the high side drive circuit and a second polarity (negative) pulse is used to effect a turn off the switch. The pulses are relatively short compared to the ON and OFF times of the switch. Thus the widths of the pulses for turning on or off the switch may be less than a fiftieth of the duration of switching cycle for the switch.

The use of relatively short control pulses has the advantage of allowing a smaller transformer.

Figure 4:
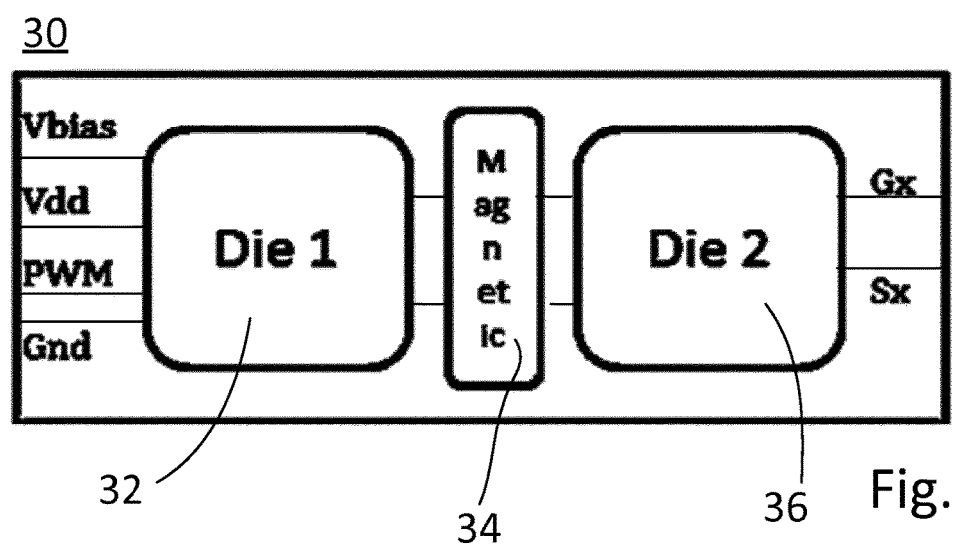
FIG. 4 is a module according to a first aspect of the present application.
Figure 5:
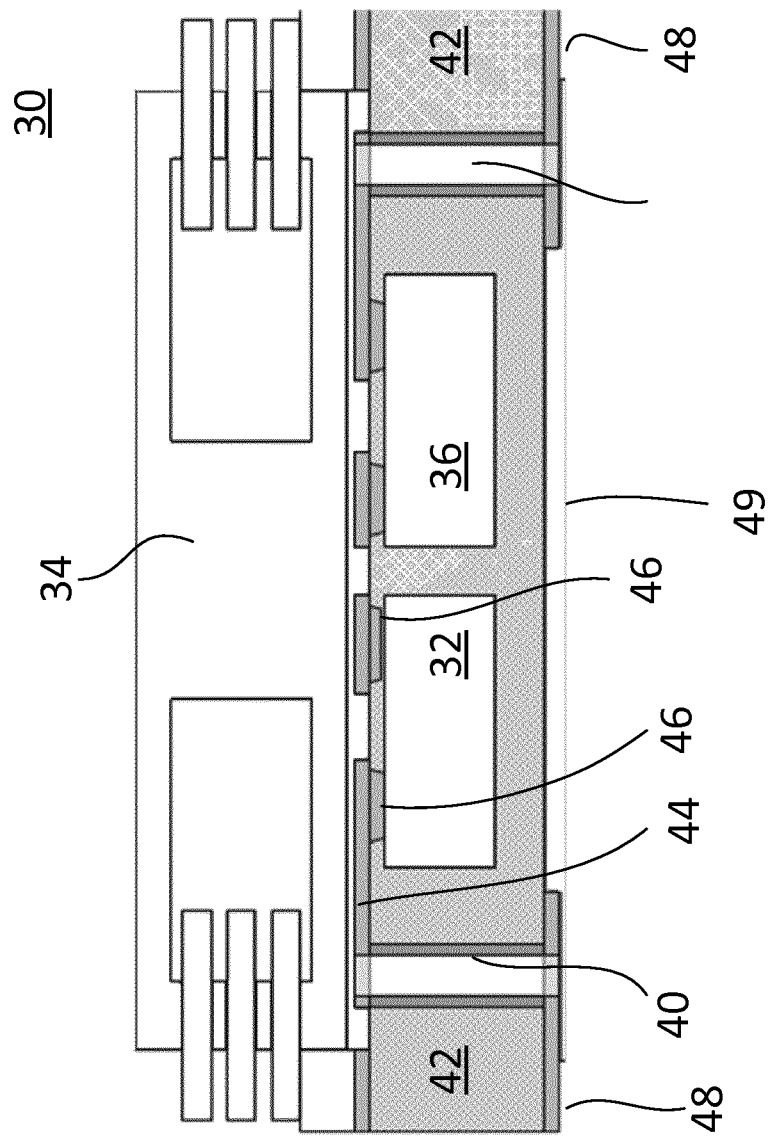
FIG. 5 is a cross sectional view of an exemplary mechanical assembly for the module of FIG. 3.

The use of a smaller transformer allows for a high side drive circuit to be provided as a single component, as shown for example in FIGS. 4 and 5. This single component 30 may be employed, for example, within a switching circuit such as the exemplary switching circuit 50 illustrated in FIG. 6.

Such a single component may be suitably configured for mounting directly onto a circuit board. To achieve this, the component 30 may have surface mount connections 48 provided thereon. Similarly, a lead frame (not shown) or other structure may be provided to provide legs to allow the single component be employed as a plated through hole component.

An advantage of the single component is that it may be designed to operate as a high side drive circuit without requiring additional external components for the switching function.

The present application provides for an isolated high side drive circuit module suitable for driving a high side switch where the isolation is provided by a transformer. The module which is conveniently provided in a single package 30 comprises a low side circuit 32 for responding to an input control (e.g. PWM) signal, a high side circuit 36 for providing drive signals to a high side switch. Drive signals are transferred from the low side to the high side using a transformer 34.

More specifically, a low side circuit on the primary side of the transformer receives an input drive signal (PWM). In response to which the low side circuit provides a control signal through the transformer to a high side circuit which responds to the control signal and provides an output drive signal to the high side switch at nodes Gx and Sx. Other inputs including a supply voltage (Vdd) and ground connection (Gnd) are provided for the operation of the first integrated circuit 32. As will be explained below, a further input Vbias may be provided. Alternatively, the supply voltage may act as the Vbias.

The module as described above is suitably assembled and packaged as a single component. It will be appreciated that the resulting component may thus be placed on a circuit board using conventional circuit assembly techniques. Thus as example, the dimensions and shape of the single component are such that it may be placed using a conventional pick and place machine. For example, the component may be mounted as a surface-mount-device (SMD) on a printed circuit board (PCB) as a drive circuit in a system for example implementing the switching circuit 50 of FIG. 6.

To facilitate surface mounting, solder balls or a lead frame with J-lead mechanisms could be employed on the underside of the substrate to make the connection to a PCB. The module accordingly provides the advantage of the arrangement of FIG. 3, i.e. a low component count. Indeed, it will be appreciated that it offers a single component in contrast to the additional components to the IC 21 of FIG. 3.

To facilitate ease of construction of the module, the low side circuit 32 may be implemented as an integrated circuit. At the same time, the high side circuit 36 may also be implemented within an integrated circuit. By implementing the high and low side circuits as integrated circuits, without additional components, the module may readily be fabricated using conventional printed circuit board manufacturing techniques.

In particular, the module may implemented by embedding the integrated circuits within a substrate as shown in FIG. 5. The substrate may a section of printed circuit board material, e.g. FR4, 42, with electrical connections to the integrated circuits made by means of vias 46 and conductive tracks 44.

At the same time, a transformer 34 may be mounted on the surface of the printed circuit board above one or both of the integrated circuits with connections provided therefrom by means of tracks and vias to the integrated circuits 32, 36. Indeed, as will be appreciated from the exemplary circuits described below, only one transformer is required for the high side drive circuit. In an exemplary fabrication process multiple modules may be formed at the same time in a common substrate. As a final part of the process, the modules may be segmented from one another.

As with the prior art, a pulse-width-modulated (PWM) signal is delivered to an input of the module. The first integrated circuit provides the signal conditioning necessary to deliver the drive energy across the magnetic transformer isolation barrier to the second integrated circuit. The second integrated circuit then provides for the energy management of the drive signal to ensure its delivery to an associated high side switch. The associated high side switch may for example be a power MOSFET.

Vias 40 may be provided to connect the inputs to the first IC and outputs from the second IC to surface mount connections 48 on the bottom of the module so as to allow the module to be pick and placed directly onto a circuit as required to form necessary connections in a switching circuit on a circuit board.

At the same time, the bottom surface of the circuit board may have an insulating layer 49 applied thereon in areas other than the connections 48 to provide for insulation and creepage distances.

Figure 3:
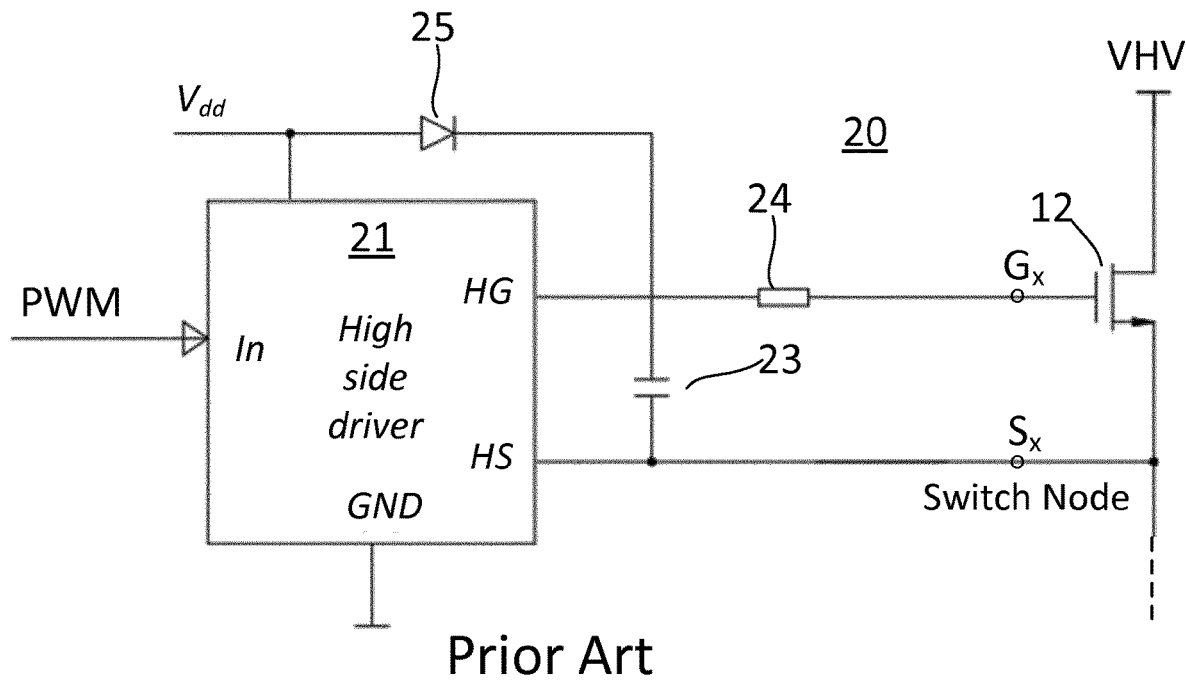
FIG. 3 is a further example of a known approach to implement a high side drive circuit using an integrated circuit.

It will be appreciated that this approach of using two integrated circuits is counter intuitive, since the approach requires increasing the number of integrated circuits when compared to either of FIGS. 2 and 3. However, the cost of the integrated circuits and transformer is generally less than that of the arrangement of FIG. 3 and easier to manufacture because of reduced component count to that of FIG. 2. At the same time, circuit designers need not be concerned about ensuring creepage and isolation distances, as would be the case in FIG. 2, since they would already addressed in the module.

Additionally, as the integrated circuits may be produced using conventional low voltage processes, e.g. conventional CMOS, the problems of static power consumption, propagation delays, slow rise and fall times, limited dv/dt and negative swing limitations associated with the IC 21 of FIG. 3 are overcome. This in turn allows for switching frequencies well into the MHz region of operation.

Figure 6:
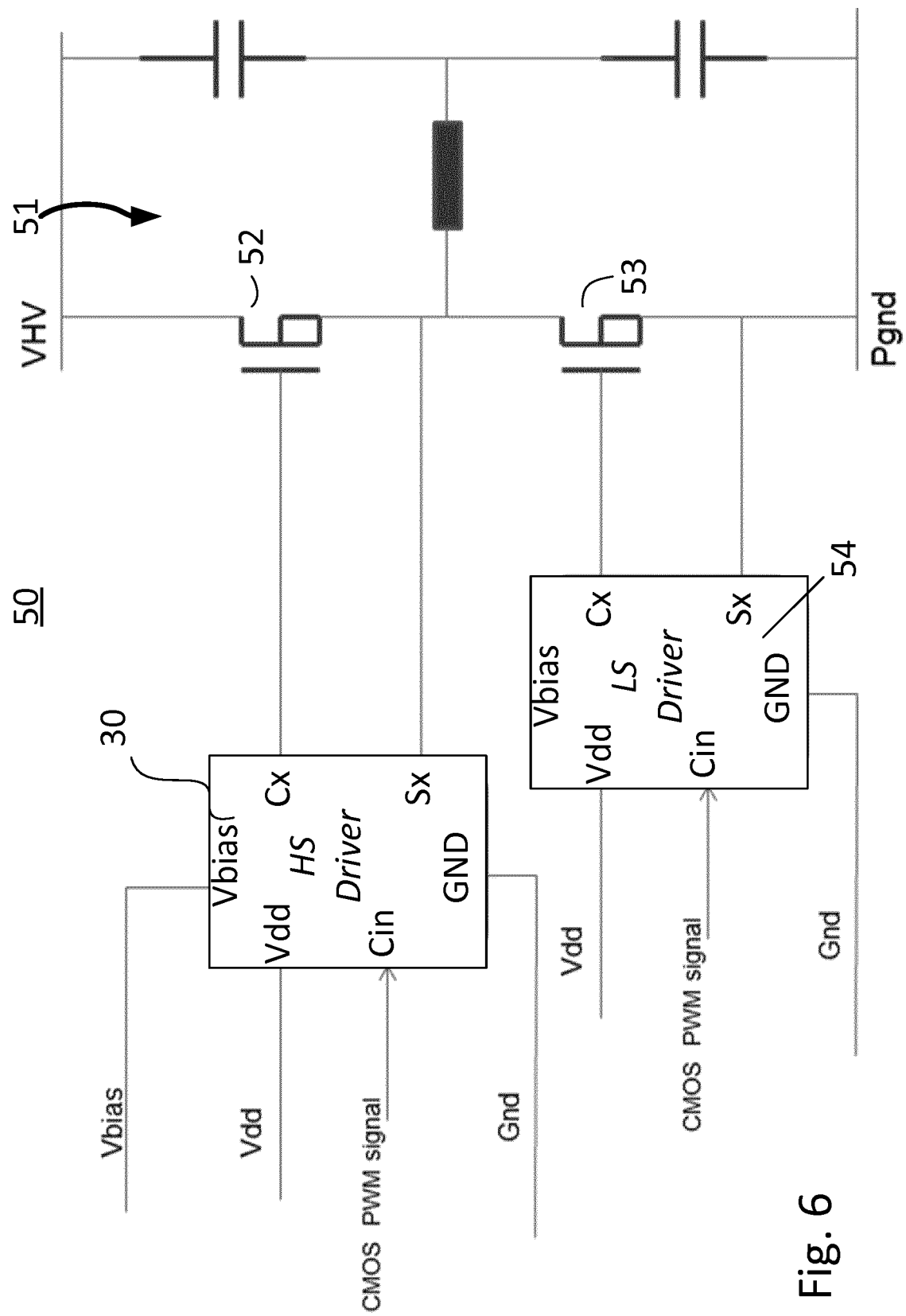
FIG. 6 illustrates the use of the module of FIG. 4 in an exemplary switching circuit having a high side switch and a low side switch, in which the high side driver is implemented without the presence of additional external components.

The resulting module may be employed as a high side drive circuit. An exemplary high voltage switching circuit 50 employing such a high side drive circuit is shown in FIG. 6, in which there is a switching arrangement 51 to be controlled having a high side switch 52 and a low side switch 53.

It can be seen that the configuration is extremely simple with the module 30 described above providing a drive signal to the high side switch. Another of these modules might be used to provide a drive signal to the low side switch 53, although a conventional low side drive circuit 54 may be employed.

One of the problems identified with the prior art is their inability to provide a high frequency drive signal. The present application provides a solution to this problem, whilst efficiently delivering the drive energy across the isolation boundary, by managing the reset of the magnetic flux in the transformer. The arrangement which will be described below implements fast reset of the magnetic flux in the core. This feature allows for operation frequencies into the MHz range (referencing the switching frequency of the switching circuit). Passive reset techniques would take too long to reset the magnetic flux and thus limit the frequency of operation. This technique actively manages the magnetic flux reset. Whilst active reset circuits are known in high side drive circuits, they employ a single-ended two transformer approach. In this approach, a first ground referenced switch is employed to deliver an "on" pulse through one transformer and similarly another ground referenced switch is employed to deliver an "off" pulse through a second transformer. However, such an approach may be regarded as cumbersome and is complex and costly from a manufacturability point of view.

The present application provides for a single transformer approach in which the "on" and "off" control signals are delivered through the same transformer.

Figure 7:
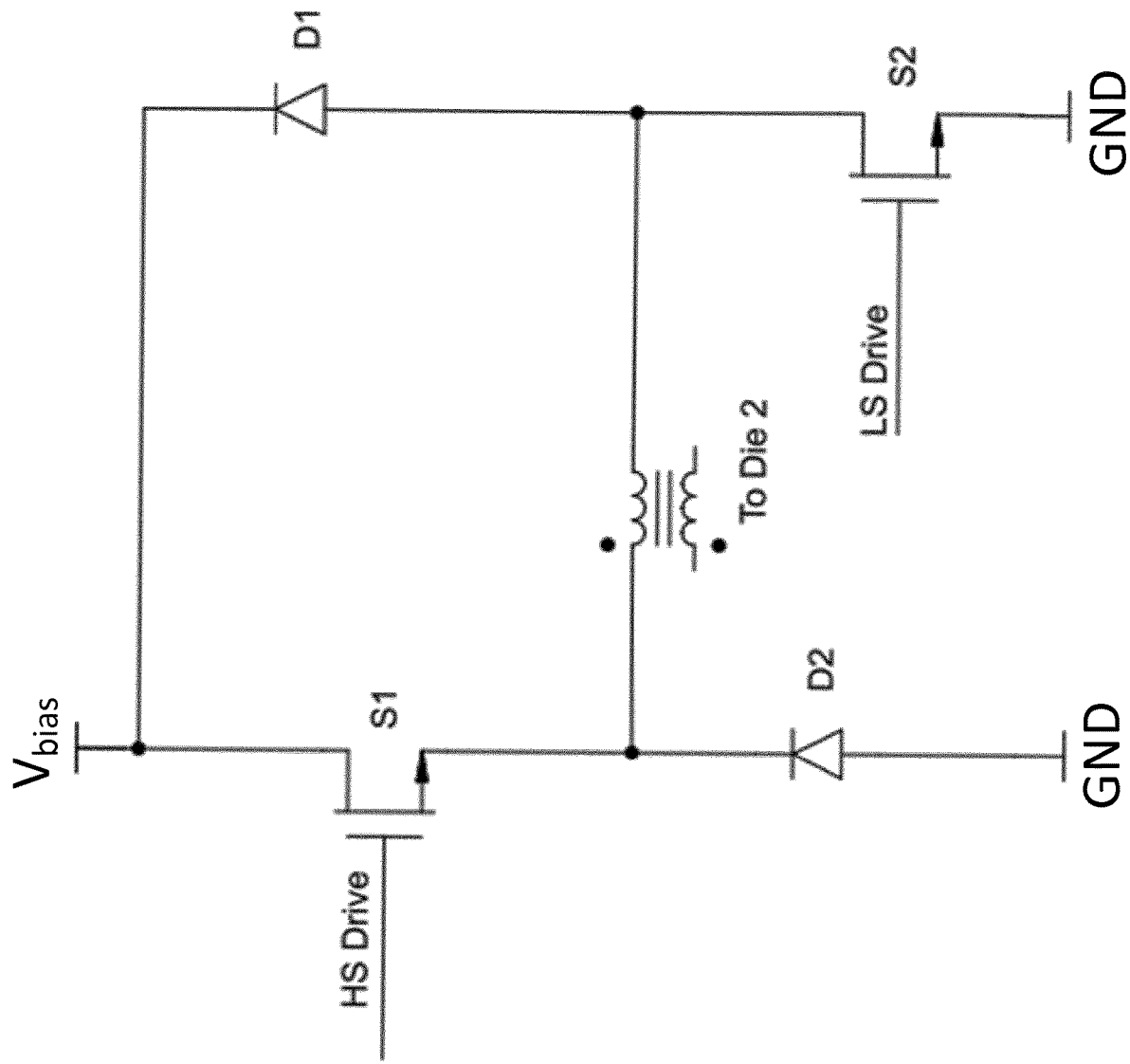
FIG. 7 is an exemplary two switch forward structure with MOSFETs and diodes which may be employed to transmit a switching pulse from a primary side of the high side drive circuit through a transformer to a secondary side.

FIG. 7 shows an exemplary low side circuit, comprising a two switch forward structure, for driving a single magnetic transformer to provide both "ON" and "OFF" signals. In this implementation, the two switch forward structure would be implemented on the low side integrated circuit 32 (Die 1). It will be appreciated that the low side circuit is arranged in a bridge configuration between two voltages (e.g. $V_{bias}$ and a reference voltage (GND)), the transformer 34 is connected across the output of the bridge. Each arm of the bridge comprises a switch in series with a rectifier (S1-D2, D1-S2). It will be appreciated that when the two switches (S1, S2) are closed energy is delivered across the transformer 34 to the second integrated circuit 36 (Die 2). Die 2 in turn delivers this energy as gate drive voltage and current to the output pins Gx and Sx. The drive signal provided from Gx and Sx are suitable for turning on a switching device.

When the switches, S1 and S2, are turned off the transformer core sees $V_{bias}$ applied in the reverse direction from the primary winding of transformer 34 which in turn cause a current to flow through the diodes, D1 and D2, thus resetting the core. Such a configuration might be employed in the arrangement of FIGS. 4 and 5. However, whilst this half bridge approach may be faster that previous approaches, it might generally still be considered a passive reset.

In one embodiment, the present application provides for active drive and active reset of the transformer core. An exemplary way of achieving this is the four switch (S1, S2, S3, S4) full-bridge (FB), approach shown in FIG. 8. To avoid confusion with S1 and S2 of FIG. 7, the switches are identified as Q1-Q4. It will be understood that the switches Q1-Q4 may be similar to those used for S1 and S2.

It will be appreciated that this arrangement corresponds to the arrangement of FIG. 7, with one diode D1 replaced by a third switch S3 and the second diode D2 replaced by a fourth switch S4. This approach allows for active resetting of the transformer core using S3 and S4. When S1 and S2 are switched on, drive energy is delivered through the primary winding across the isolation barrier of the transformer to the secondary winding which in turn is connected to Die 2. Die 2 in turn is employed to deliver energy to a high side switch to turn it on. When S3 and S4 are turned on, with S1 and S2 turned off, the core is reset. Once the core is reset, the circuit on Die 1 may be placed in a resting state by turning on either S1 and S3 (with S2 and S4 turned off) or S2 and S4 (with S1 and S3 turned off). It will be appreciated that an advantage of the full bridge structure is that it allows the delivery of either positive or negative voltage signals from Die 1 to Die 2. Thus to deliver a positive pulse, switches S1 and S2 may be switched on. In contrast to deliver a negative pulse, switches S3 and S4 may be switched on.

In operation, the positive voltage signals may be used as energy transfer to turn on the external switch. In which case, the negative signals may be employed to turn off the external switch. For a given circuit on the secondary side of the transformer (i.e. Die 2), that the opposite may be employed, i.e. a negative pulse on the primary side to switch on and a positive switch on the primary side to turn off merely by inverting the connections to the primary or secondary winding. Accordingly, reference may be made to using one polarity to switch on and the opposite polarity to switch off.

The use of a full bridge structure on the primary side allows the circuit on the primary side (Die 1) to drive positive and negative going flux swings in the magnetic core. This means that the effective magnetising current is divided by two. This reduction in magnetising current in turn reduces circulating current losses by a factor of four.

In the above mentioned resting state, any residual core energy is allowed to circulate in the turned on switches and the core. This has the advantage of maintaining zero volts across the primary and thus the secondary of the transformer. More particularly, in comparison with FIG. 7, the use of 4-switch configuration allows for the circulation of magnetizing current in the two upper or two lower switches, whereas the 2-switch configuration does not. This allows magnetizing current to keep circulating before a decision is made to both reset the core and transfer a turn-off signal across the isolation boundary in one event.

Figure 8:
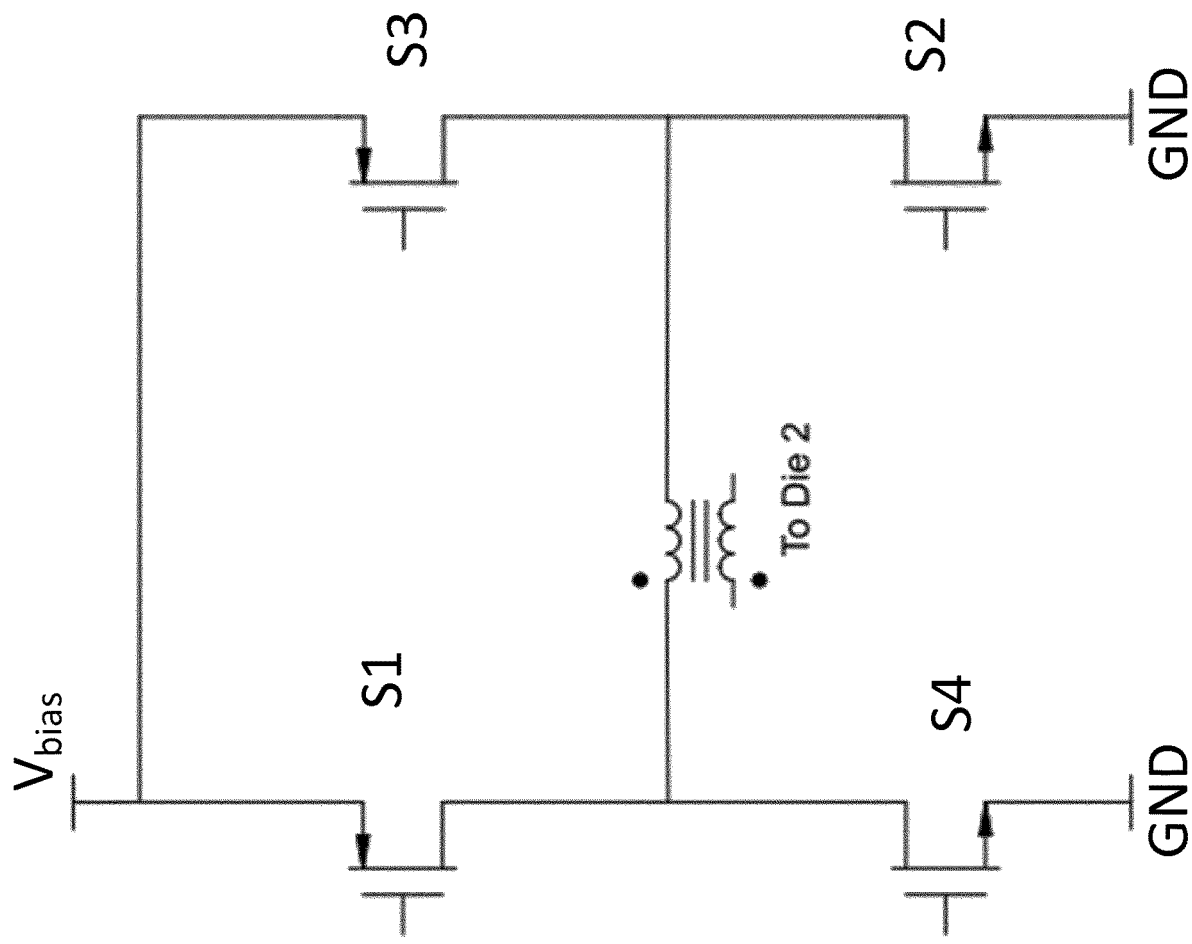
FIG. 8 is an alternative structure to that of FIG. 7 employing a four switch full-bridge structure with MOSFETs to transmit a switching pulse from a primary side of the high side drive circuit through a transformer to a secondary side.

The arrangement of FIG. 8 may be modified to provide further advantage or features. As an example, a further improvement on the 4-switch FB approach of FIG. 8 is shown in FIG. 9.

Figure 9:
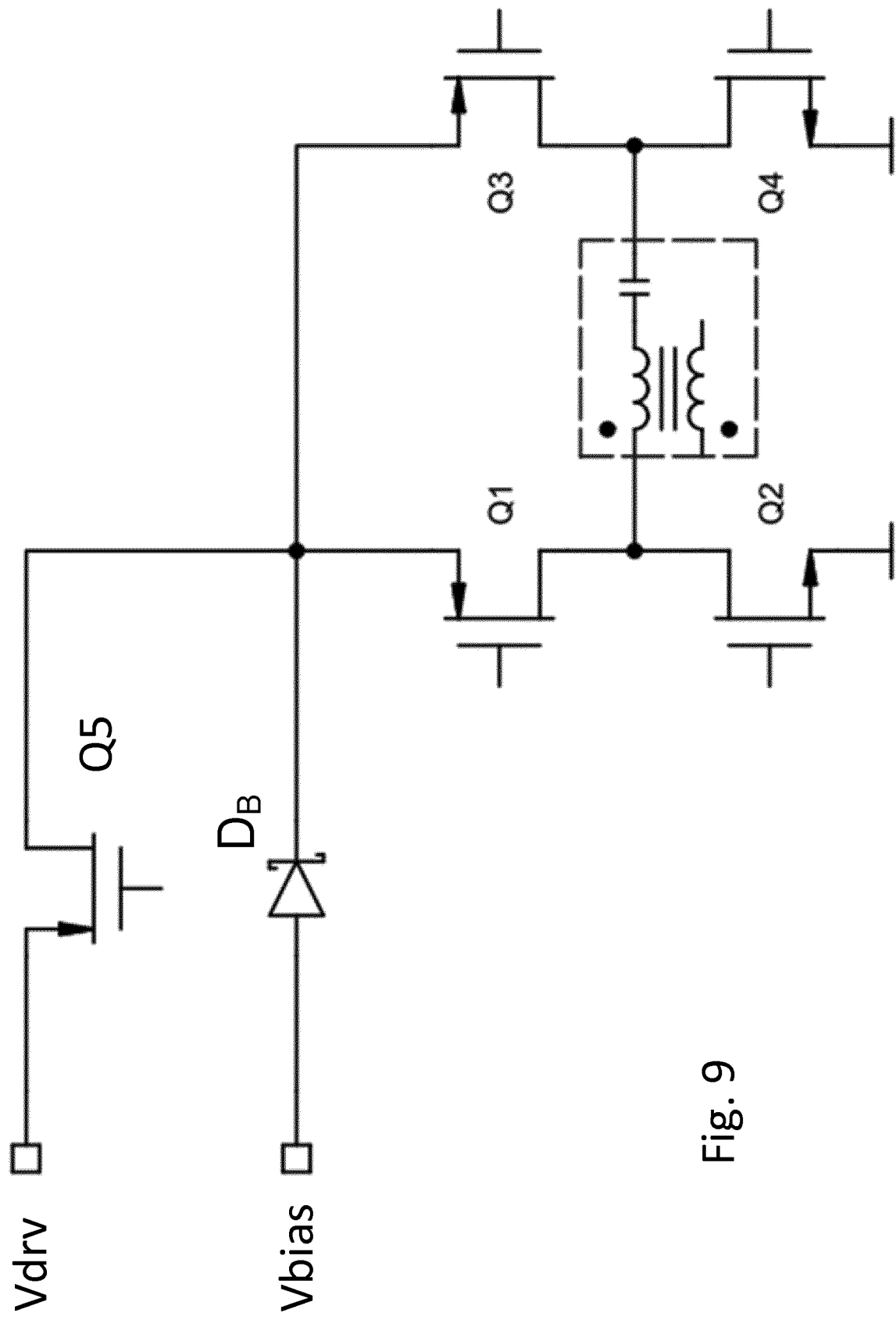
FIG. 9 corresponds to the circuit of FIG. 8 with the possibility of using different pulse voltages based on the switching in or out of a supply voltage.

Whilst FIG. 8 was explained in the context of being an improvement on FIG. 7, and thus maintained the same switch numbering convention, FIG. 9 employs a numbering convention as might more commonly be employed in a full bridge configuration. However to avoid confusion, reference to switches S have been replaced with references to the switches being transistors Q as follows Q1=S1, Q2=S4, Q3=S3 and Q4=S2.

An additional switch, Q5 is added. The additional switch allows a drive voltage $V_{drv}$ to be switchably connected to a node at the top of the bridge. A diode, $D_B$, connects a bias voltage $V_{bias}$ to the same node. The inclusion of these additional components allows the supply voltage to the bridge to be modulated. More particularly, switch Q5 may be employed to switch the supply voltage to the bridge between $V_{drv}$ and $V_{bias}$ (or more correctly $V_{bias}$ less the voltage drop across diode $D_B$). It will be appreciated that for this to occur correctly $V_{drv}$ should be selected to be higher than $V_{bias}$. This modulation capability may be employed to advantage to discern between on and off signals transferred from Die 1 to Die 2.

In FIG. 9, a capacitor is shown in series with the primary side of the transformer. Whilst, the use of a capacitor is not essential, it does ensure that the transformer core is flux balanced where the drive signals from Die 1 are not perfectly matched in time for on and off signals. This capacitor may be implemented as part of Die 1 or external to Die 1, for example it may be implemented as a discrete component placed along with the transformer assembly.

It will be appreciated that a problem with some of the prior art, is that circuit configurations were only suited to one type of high side switch, e.g. a capacitive type load as found in FETs or a resistive load as found in bipolar transistors.

The present application provides an arrangement, that may be employed to drive both capacitive and or resistive or PN junction type loads. In the case of a capacitive load it is envisaged to deliver a single pulse from Die 1 to Die 2 to turn on or off the external switch. In the case of a resistive load the drive circuit will need to provide a continuous current. In this case repeating pulses would be delivered from Die 1 to Die 2 to top-up a storage capacitor. The storage capacitor could be part of Die 2 or external to Die 2. This mode of operation may be referred to as a 'trickle' mode.

The various modes of operation are set forth in the truth-table of FIG. 10. It will be appreciated that a controller may be employed to select the modes as required in response to an incoming PWM signal.

FIG. 10 shows a truth table for various configurations of the switches and the corresponding name of the modes of operation. The first two states, State #1 and State #2 are 'Rest' states where the magnetising current built up in the core during and off or an on state are circulated in either the top two PMOS transistors (Q1 and Q3) or the bottom two NMOS transistors (Q2 and Q4). This allows for maintaining, and not wasting the magnetising energy of the core. State #3 is the energy transfer state from Die 1 to Die 2.

Figure 11:
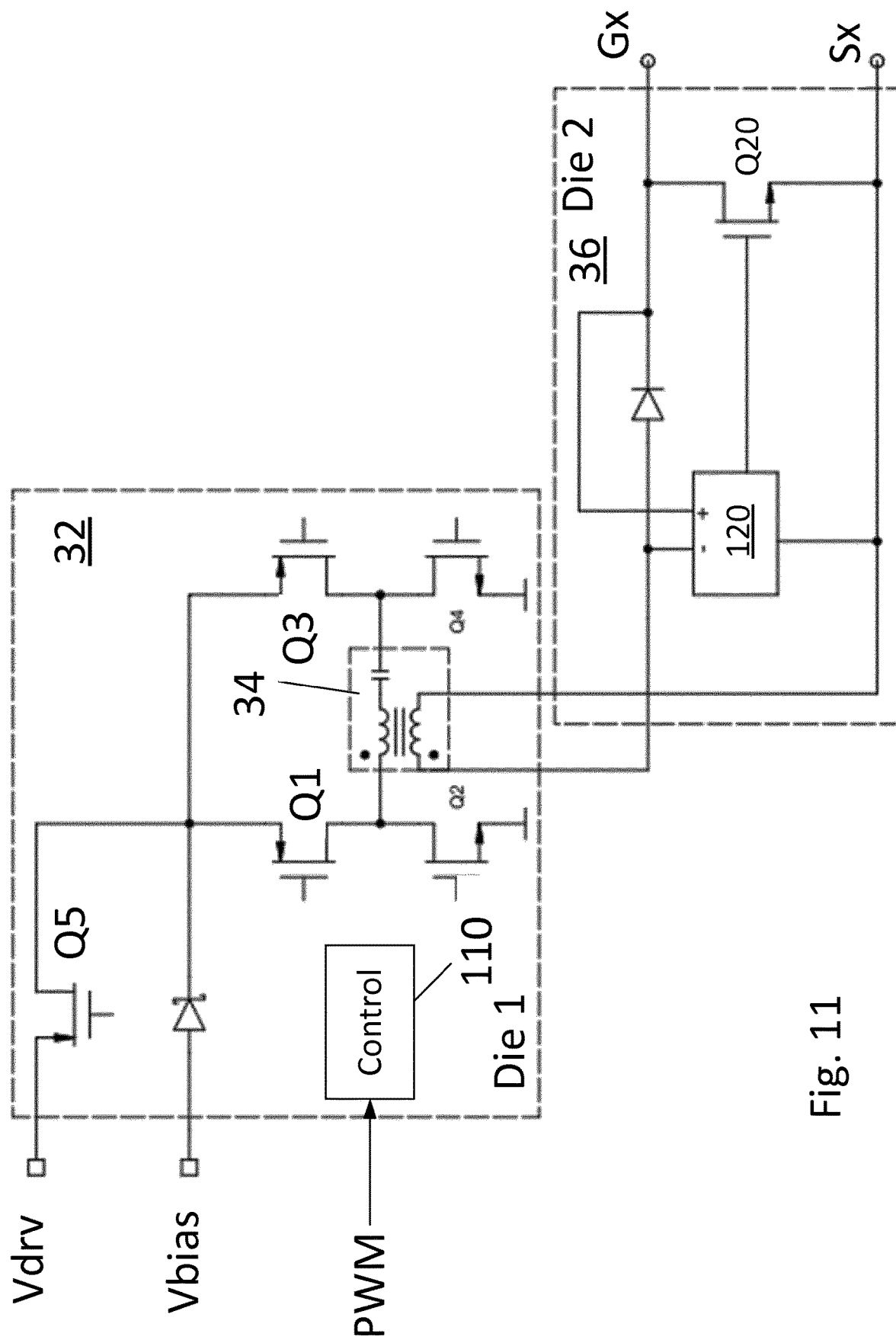
FIG. 11 is a circuit diagram for an exemplary approach to implementing the arrangement of FIG. 9 within a module such as that of FIG. 4 with a decision making level detect block on the secondary integrated circuit deciding the signal transfer mode based on the voltage of the pulse transmitted.

This is the on state of the drive circuit. Energy is transferred from the Vdrv or Vbias to Die 2 where it generates the drive signal for the external switch. State #4 is both the reset and potentially the off state of the drive circuit. The transformer magnetising energy, which was maintained during the 'Rest' state, state 1 or 2, is returned to the Die 1 supply Vdrv and delivers a negative voltage to Die 2. Furthermore it generates a negative going flux in the transformer core. This optimises the use of the transformer core generating flux in both positive and negative directions in the core. States #5 and #6 are 'Trickle' states. Trickle state #5 delivers energy from Vbias across isolation barrier to Die 2. This is used as a top-up mechanism to maintain energy transfer into a PN junction type external switch for example. Trickle state #6 resets the core after a trickle state #5 and turns off the trickle energy flow on Die 2, thus stopping the trickle top-up pulse delivered while in state #5. It will be appreciated that a control circuit 110, as shown in FIG. 11, for operating the various states may be embedded within the first integrated circuit (Die 1). Additional inputs may be required to assist the control circuit. These inputs may include one to identify the type of switch being switched and a clock signal for generating the required signals for operating switches Q1-Q5. It will be appreciated that the control circuit is not shown in all the figures for ease of illustration.

The control circuit is responsive to an incoming PWM signal. The control circuit performs an edge detect function on the PWM signal to be transferred to control a high side switch. In response to detecting the arrival of a positive edge on the PWM, the control circuit causes a narrow pulse to be delivered to the transformer primary side, i.e. by switching the transistors to correspond to state 3. The narrower the pulses the smaller the Volt-Seconds product and the smaller the magnetic core required for the transformer. However, a very narrow pulse will not leave enough time for the required drive energy to be delivered through the system. So a suitable minimum pulse width should be found to suit the application. It will be appreciated, that the choice will depend on the characteristics of the high side switch being switched and the switching frequency. In this respect, the previously discussed trickle state may require additional circuitry to produce the requisite pulses.

In effect, it will be appreciated that the arrangement provides for the transfer of a "ON" signal across the transformer to turn "ON" a high side switch and that using it additionally allows for the subsequent transfer of energy by means of a separate pulse having different characteristics to the "ON" pulse to maintain the high side switch "ON" where it is a resistive load.

It will be appreciated that corresponding circuit intelligence is required on the secondary side of the transformer to respond to the signals passed from the primary side to the secondary side.

Thus, as shown in FIG. 11, a secondary side circuit is provided (with level detect and comparator functionality 110) on Die 2. This secondary side circuit uses the states of operation on Die 1 to discern between "ON" signal and an "off" signal.

If Die 2 determines that an "ON" signal is coming from Die 1 across the isolation barrier to Die 2 then the delivered energy is transferred to the output pins Gx and Sx turning on a connected external (high side switch) and if necessary providing current to maintain the high side switch on. If Die 2 determines that an "OFF" signal is coming from Die 1 across the isolation barrier to Die 2 then the energy is used to turn off the switch connected to Gx and Sx.

In FIG. 11, Die 2 receives a signal through the isolation barrier from Die 1. A level detect block 120 on Die 2 decides from the voltage amplitude delivered if it is a turn "ON" or turn "OFF", Rest signal or trickle transfer that is being transmitted. The state delivered is dictated by the circuit on Die 1.

As with the FIGS. 8 and 9, in FIG. 11 the full bridge structure allows the delivery of either positive or negative voltage signals to Die 2. The positive voltage signals are used as energy transfer to turn on the external switch (i.e. the high side switch being controlled). An important feature is the use of the negative signals to turn off the external switch. In FIG. 11, the level-detect circuit detects negative going pulses and uses this to activate a discharge switch to discharge the voltage between Gx and Sx, i.e. to discharge the gate capacitance of the high side switch. The discharge switch is represented by Q20 in FIG. 11 but may be any suitable switch or arrangement of switches to achieve the discharge. It will be appreciated that the level detect is detecting both positive and negative going voltages. So after the ON pulse is delivered, the external FET is turned ON and Q20 stays off. Only when a negative pulse is delivered across the isolation boundary (which is facilitated by the 4-switch structure) does the level-detect circuit react and turn ON Q20 to effect a turn of the external switch.

Figure 12:
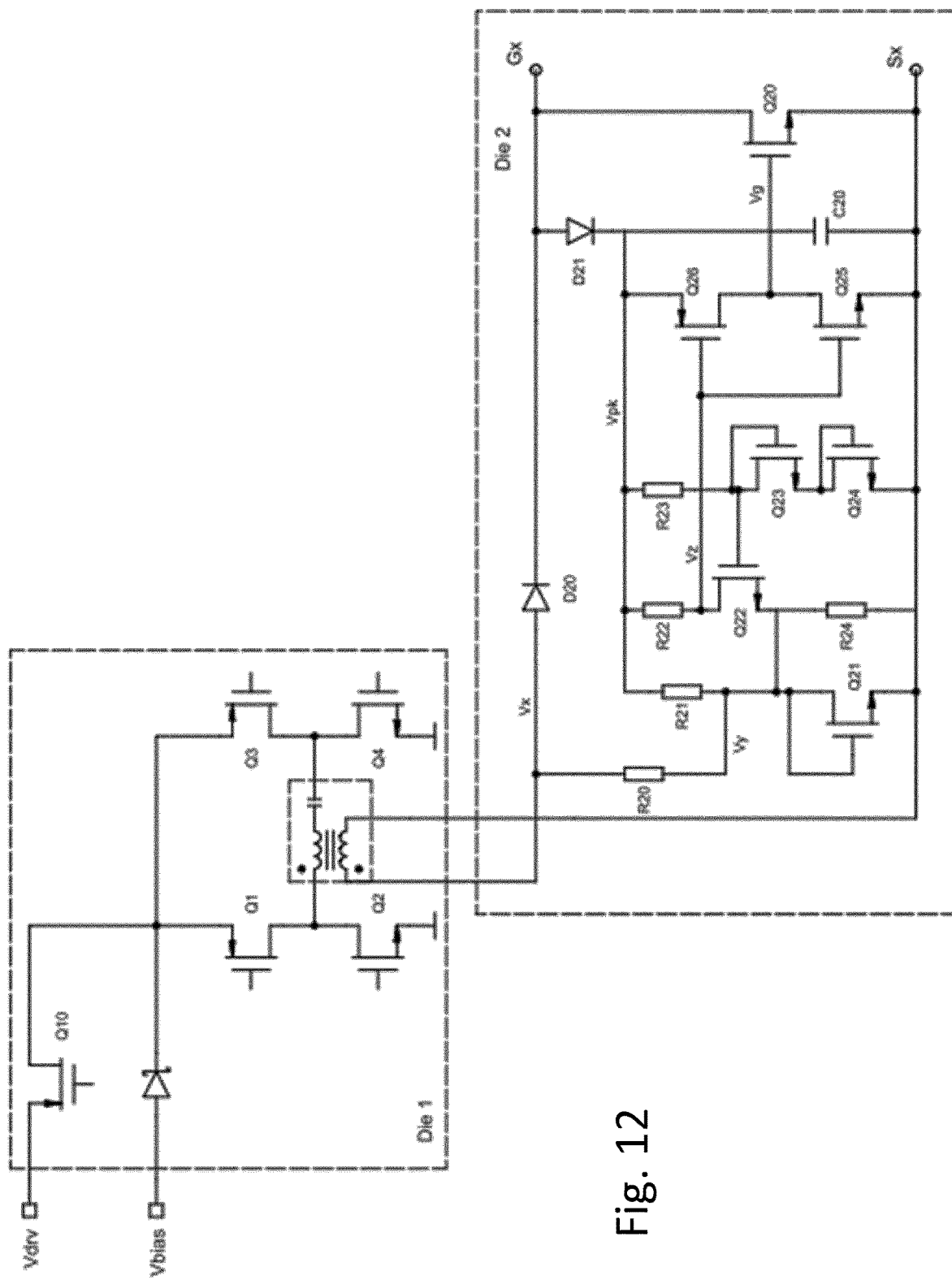
FIG. 12 is a circuit diagram for an exemplary approach which uses negative pulses transmitted from the primary side of a module to turn off the external switch.

FIG. 12 shows a configuration which detects negative signals (or pulses) for initiating a turn off of the external switch—state 4 (FIG. 10).

During the first on pulse, the voltage from the transformer is passed through a first diode D20 to the Gx node. A second diode D21 is connected to this node which in turn charges a capacitor C20 to the peak voltage of the voltage on node Gx. This provides a bias voltage Vpk. The gate of transistor, suitably a NMOS transistor, Q22 is then biased at a first voltage, for example $2 \times V_{tn}$ (as provided by the arrangement of diode connected transistors Q23 and Q24) where $V_{tn}$ is the threshold voltage of the NMOS transistor.

At the same time, the source of Q22 is biased at a second voltage which is less than the first voltage, for example a value of $V_{tn}$. This value may, for example, be provided by the diode connected NMOS transistor Q21. With suitable sizing of these devices Q22 is maintained close to its threshold voltage but not fully turned on.

In the event of an "OFF" signal being transmitted from Die 1, a negative voltage is presented to R20 at Vx. This pulls current through R20 which is sourced in part from Vpk through R21 and through R22 and Q22 and into R24. This in turn causes Q22 which is acting as a source switched amplifier to turn on. This in turn reduces voltage Vz from Vpk towards the reference potential at node Sx. Vz is provided as an input to an inverter formed by a transistor combination Q25 and Q26. The arrival of an effective low voltage state into the inverter causes the inverter to present a high and thus turn on Q20 via the gate voltage Vg. The discharge transistor Q20 in turn discharges the drive energy on the external switch connected between Gx and Sx. As a result, it will be appreciated that a negative going pulse on Vx (i.e. arriving across the transformer from Die 1) turns off the external switch. Positive going pulses on Vx have no effect on Q22 as it remains in the off state. Q21 serves also to limit the positive swing on Vy as it is a diode connected device. This limit of positive swing on Vy serves as a protection for Q22.

Figure 13:
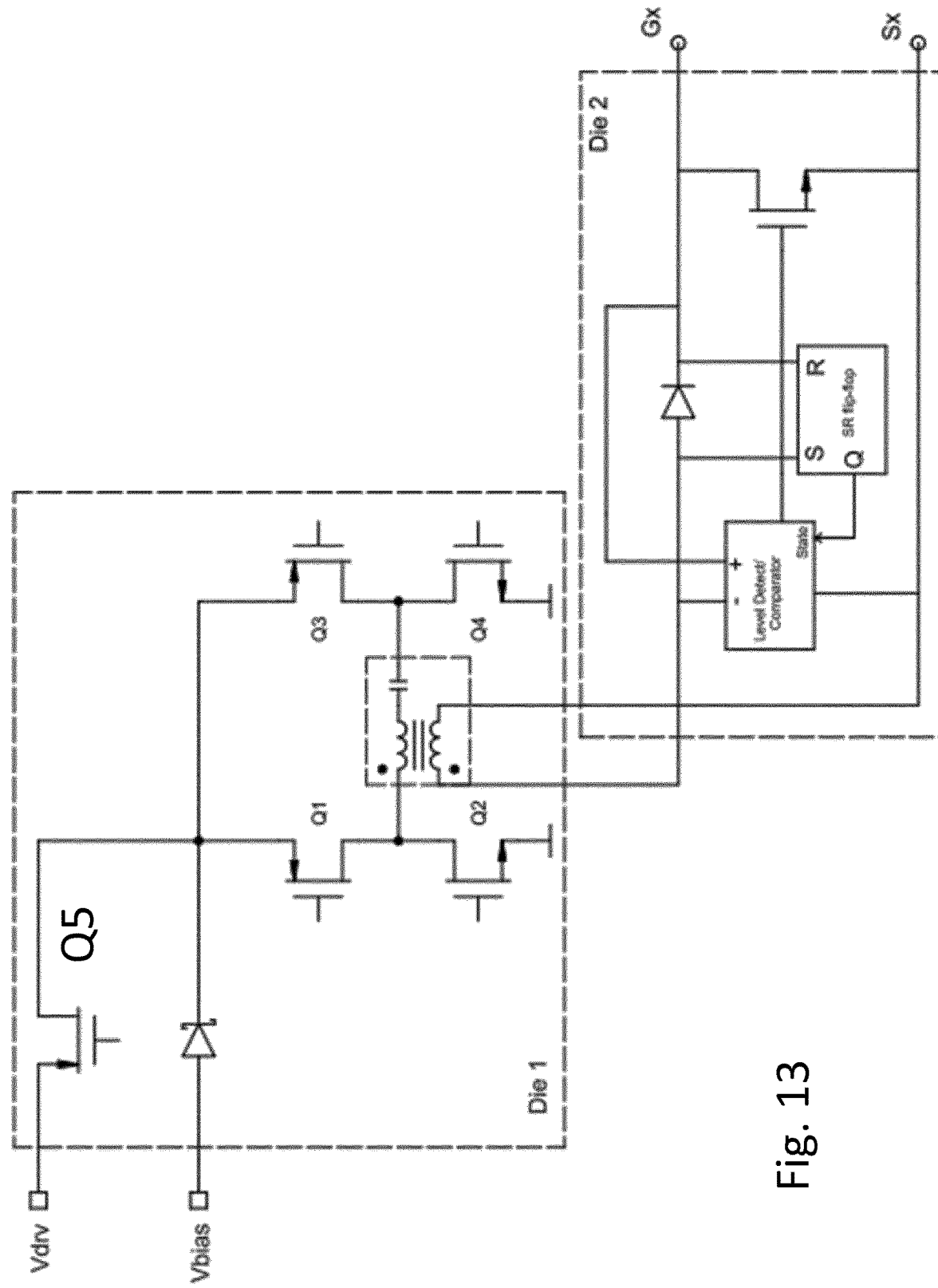
FIG. 13 is an exemplary circuit employing both level detect and timing detect information.

FIG. 13 shows another potential implementation which is based on both timing and voltage level detect. This implementation uses an SR flip-flop to decide if delivered energy from Die 1 is an ON or an OFF signal. The decision making is based on the idea that an OFF will always follow and ON and that an ON will always follow an OFF. A combination of both the voltage levels and the timing is used for reliability improvement where both decision making mechanisms must make the same decision before an on or an off event is activated. An SR flip-flop is shown in FIG. 13 but any decision making mechanism is envisaged here, e.g. D-type flip-flop.

It will be appreciated that the circuit arrangements on the secondary side have been explained generally in the context of driving a capacitive load, e.g. FET gate type devices including MOSFETs and IGBTs. It will equally be appreciated that the circuits may be modified to drive resistive loads such as bipolar transistors. In these arrangements, the trickle mode available from the primary may be employed to transfer a charging voltage across the barrier which may be employed to maintain the drive current to the transistor pending the arrival of an off pulse.

The advantages provided by different aspects of this application will depend on what the present application is compared with, but may include for example:
  Single transformer used instead of a two transformer circuits
  One primary and one secondary winding. This simplifies the mechanical structure and improves dramatically the manufacturability
  No need for HV foundry process nodes to implement HV drive circuits. For example a 500V HS drive circuit can be implemented using low-voltage foundry process nodes
  No bootstrap components required
  No external components required
  All functionality contained in one package since the die and magnetics may be provided within a single module which in turn may be mounted or placed on a PCB as a single component.
  Improved rise and fall times when compared to existing implementations
  Improved propagation delay times when compared to existing implementations
  Improved voltage dv/dt limits when compared to existing implementations. This is due to elimination of HV floating wells on the die
  Improved negative swing immunity when compared to existing implementations. This is due to elimination of HV floating wells on the die
  Reduced static power consumption
  Increased operating frequency capability A further aspect of the present application will now be described with reference to FIG. 14 in which a circuit is presented which is intended for use as the secondary side circuit of a high side drive circuit. The circuit, as with those described above, accepts as an input the output from the secondary of a transformer. This secondary is presented at nodes TXS+ and TXS−. As with the previous discussions, the circuit is suitable for implementation on an integrated circuit 210.

The circuit provides a conduction path directly from one of nodes TXS+ to the output OUTPU through a diode D0. The second node TXS− is directly connected to a secondary ground reference S, which is connected to a second output node OUTSS. The external switch (e.g. MOSFET or IGBT) being controlled has its control connections (e.g. GATE and DRAIN) connected across the two outputs OUTPU and OUTSS. As a result, a pulse of positive polarity received from the secondary winding of a transformer is passed directly as a control pulse to the external switch to cause it to turn on.

Additionally, the circuit provides a second circuit which is employed to turn off the external switch in response to receipt of a negative pulse and in particular by controlling a third output node OUTPD. In practise, the first and third nodes (OUTPU, OUTPD) may be commonly connected. However, there may be an advantage to leaving the first and third nodes disconnected on an integrated circuit implementing the circuit to allow greater choice to designers electing to employ the integrated circuit in their modules.

Initialisation of Secondary Die

A problem of existing approaches to implementing a secondary side of high side drive circuits is that reliable operation may not commence with the first arrival of a switching pulse. It is desirable, that the operation of any high side drive circuit be entirely predictable and repeatable. However, oftentimes, the initial operating state of the secondary side circuit of the high side drive circuit will be unpredictable and it may take several switching cycles before the circuit becomes predictable. More particularly, there is a risk that the circuitry responsible for turning off a switch may not be sufficiently energised to perform this function. As a result, the operation of a high side drive circuit may be unpredictable initially. Equally, during the initial few cycles the circuit may be prone to noise and other problems.

Alternatively stated, it will be appreciated that at start-up and before any energy is transferred from the primary side circuit of the high side drive circuit, for example a primary side integrated circuit (die 1), to the secondary side of the high side drive circuit, it will be appreciated that the secondary side circuit, for example a secondary side integrated circuit (die 2) is un-powered. Accordingly, it is desirable to transfer energy from die 1 to die 2. At the same time, it is desirable not to deliver an ON pulse to the output of the drive circuit which might cause the drive circuit to switch on the switch being driven.

The present application employs OFF pulses, or more specifically, delivering negative voltage pulses to charge the voltage supply for the secondary side.

The secondary side circuit employs an inverting charge pump mechanism which converts this negative voltage pulse train to a positive supply voltage. The secondary side circuit can then use this positive supply voltage, but is not restricted to this, to initialise any circuitry in the secondary side circuit.

Figure 14:
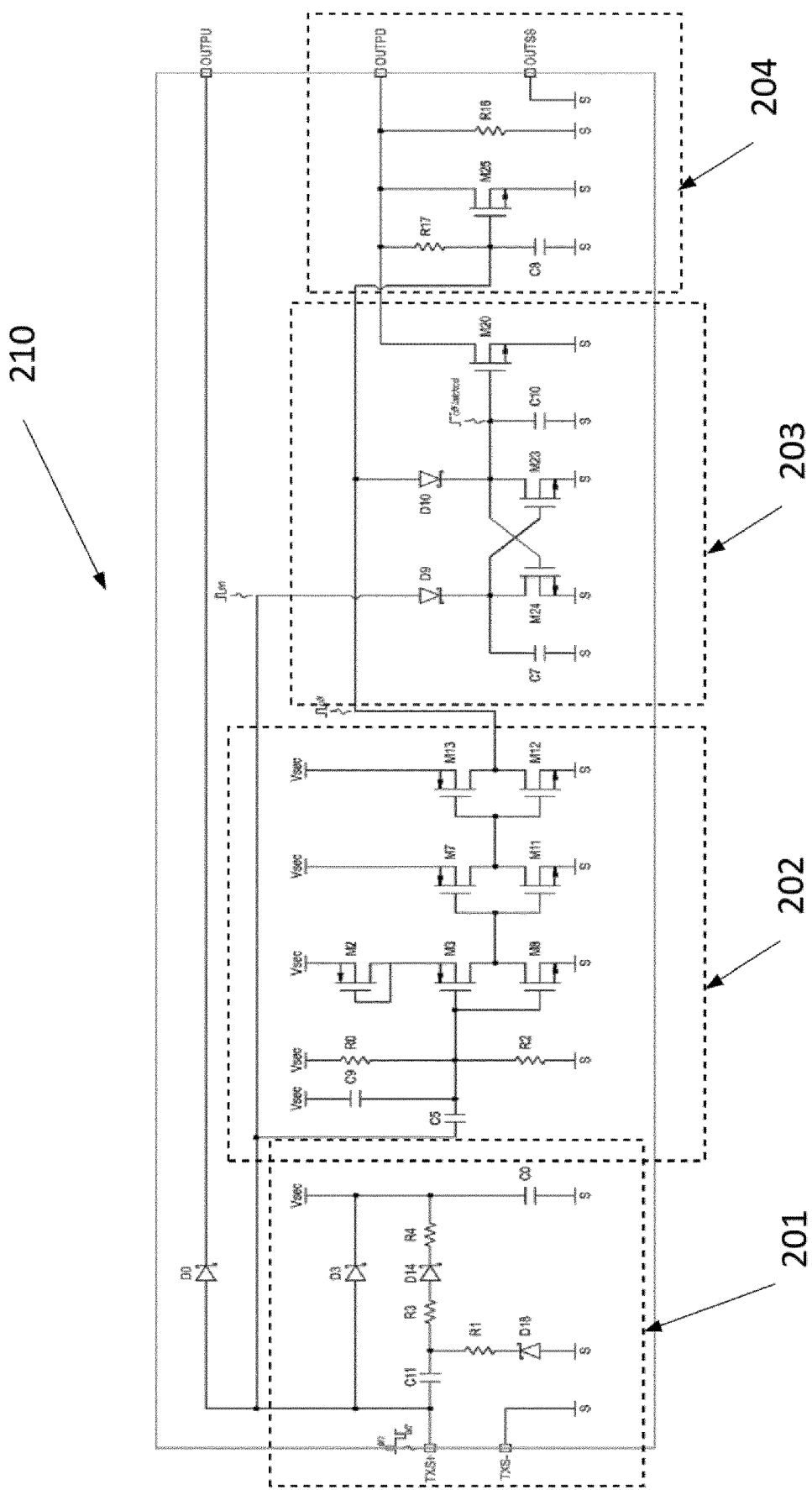
FIG. 14 is an exemplary circuit for the secondary side of an exemplary high side switching circuit.

More specifically, and with reference to the exemplary circuit of FIG. 14 a secondary side circuit is provided which has a power supply. In the exemplary arrangement, the power supply employs negative pulses to provide a positive voltage power rail for the remaining circuitry of the secondary side circuit. Positive pulses may also be employed to charge the positive voltage power rail.

The power rail is used to power circuitry which ensures that the high side drive circuit turns off the externally connected transistor it is driving when required to do so. The circuit allows for this power rail to be powered prior to the commencement of switching of the external transistor being controlled by the high side drive circuit.

Specifically, the circuit allows for the provision of a positive voltage power rail on the secondary side using one or more negative pulses. Thus in effect, one "OFF" pulse or a series of "OFF" control pulses may be used to power the secondary side voltage rail prior to the transmission of an "ON" pulse, thus the reliability of the circuit is improved because the state and reliable operation of the secondary side circuit can be guaranteed at the time normal switching is commenced. The corresponding circuit on the primary side is thus configured during an initialisation stage to cause one or more "OFF" pulses to be transmitted prior to the initial sending of an "ON" pulse.

The power supply circuit 201 accepts the outputs TXs+ and TXs− from the secondary winding of the transformer. One of these outputs is connected to the ground reference S for the secondary side. The other output is connected through a first diode, D3, to one side of a first capacitor C0. The other side of the capacitor is connected to the ground reference S. When a positive pulse is transferred across to the secondary winding, the pulse is passed through the first diode D3 and charge is added to the capacitor C0. The capacitor in turn provides a supply voltage (voltage rail) $V_{sec}$ to the remaining parts of the circuit. The power supply circuit also comprises a charge pump circuit 201 which converts negative pulses transferred across to the secondary winding into a positive voltage. The charge pump circuit comprises a second capacitor C11 which is connected on a first side to the transformer output TXS+. The second side of the second capacitor is then connected from a node through a diode resistor combination R3-D14-R4 to the capacitor C0. The node is also connected through resistor diode combination R1-D18 to ground. When a negative pulse arrives this negative voltage appears across capacitor C11 through R1 and D18. When the negative pulse ends, the capacitor is then connected through the resistor diode arrangement of R3 D14 and R4 to capacitor C0 allowing charge in C11 to pass through to capacitor C0. The resistors R1, R3 and R4 are simply current limiting resistors.

Figure 15:
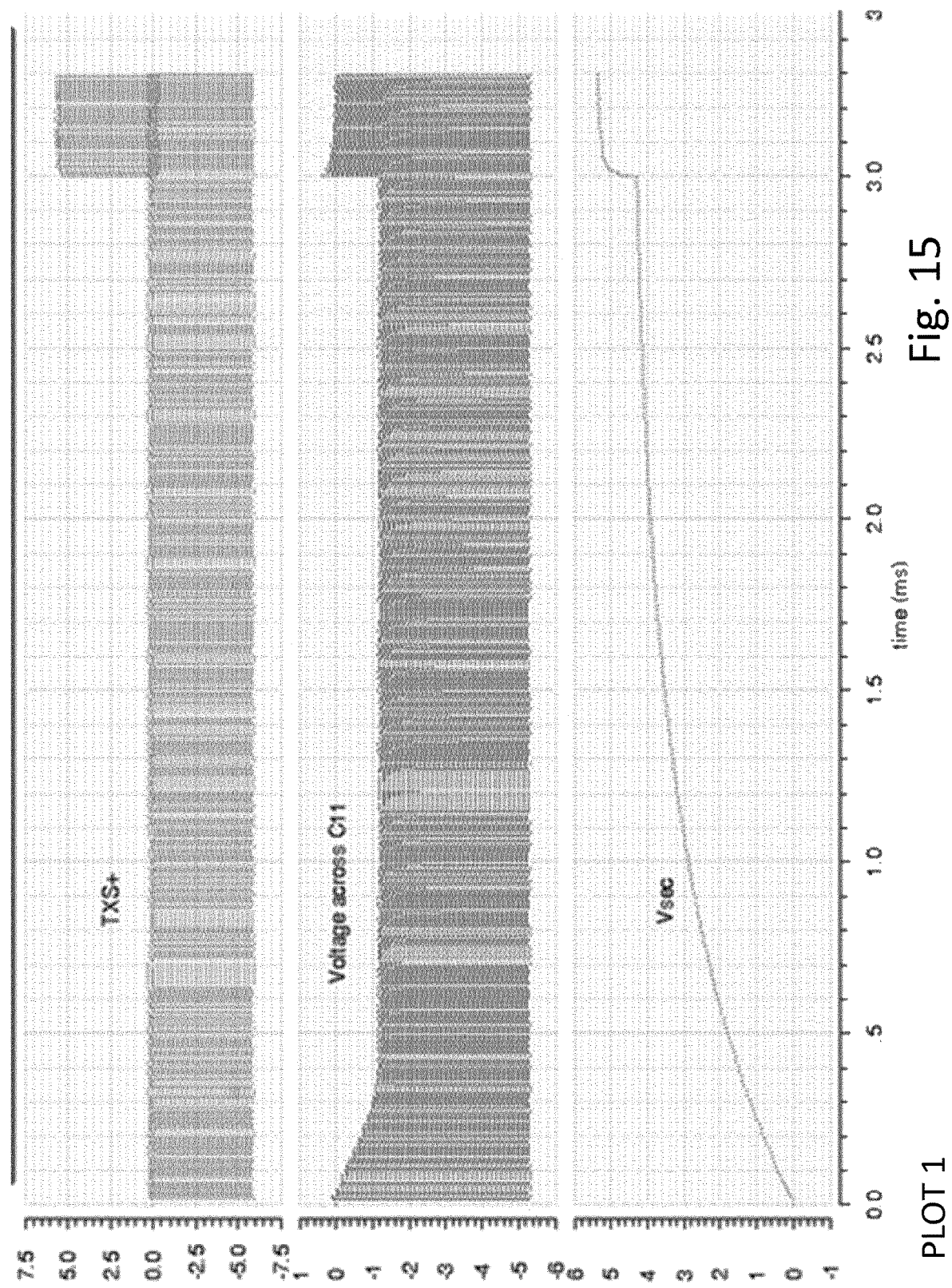
FIG. 15 illustrates exemplary waveforms demonstrating the operation of an aspect of the application.
Figure 16:
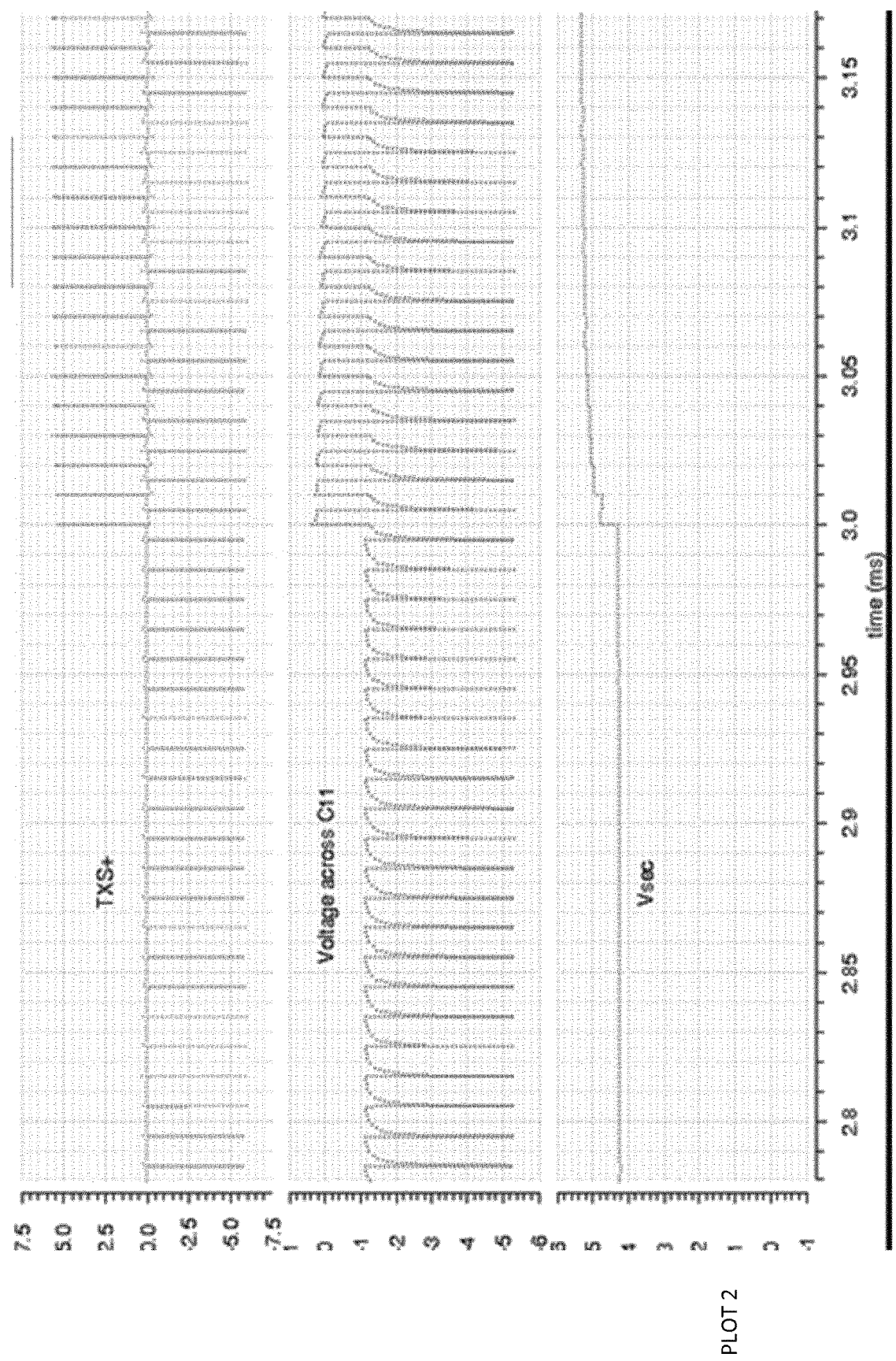
FIG. 16 illustrates an expanded section from FIG. 15.

The nature of operation of the circuit may now be explained with reference to two exemplary plots, FIGS. 15 and 16, showing waveforms for an operating circuit.

The plots commence with capacitors C0 and C11 initially 0V at start-up.

The first plot, FIG. 15, shows only narrow negative pulse (<100 ns) of −6V in amplitude applied to TXS+, with the corresponding voltage across C11 and the resultant output voltage Vsec starting from the initial condition voltages of 0V.

It may be seen that between 0 ms and 3 ms Vsec ramps to over 4V. This example is with the Cvsec=10 nF.

The second plot, FIG. 16, is an expanded view of the first plot between approximately 2.8 ms to 3.1 ms, in which it may be seen that with positive pulses on TXS+ further boosting TXS+.

Exemplary advantages of using OFF (negative) control pulses to power the secondary side are that:
- Allows floating secondary die, in drive circuit applications, to be initialised to a known state without the need for positive voltage drives to be transferred across isolation boundary.
- Transfer of negative voltage pulses are rectified to a positive bias supply on secondary floating die which can be used to put secondary die in known state as part of the initialisation procedure of the floating drive circuit system.
- The secondary side floating bias can now be used for other functions such as, but not limited to, energy supply for logic for secondary side digital functions, energy supply for communication between secondary and primary dies, energy supply for external floating components that the user may want to add as part of the system design.

The application of bipolar voltages onto a secondary die requires them to be converted into stable decisions of an ON or an OFF signal at the drive circuit output. Given that, to allow for a small transformer and minimum energy transfer, the bipolar voltages need to be relatively narrow pulses (suitably less than a few microseconds) which are thus not present for the duration of the on and off drive signal, the decision must be made and stored during the short pulse interval.

Also, given that these short pulses are bipolar in nature (e.g. ±10V) and the secondary side bias supply is unipolar (e.g. +10V) the decision making circuit must be immune to this and reliable as a first requirement.

Furthermore at the moment a state decision is made the common mode voltage of the secondary die can ramp upwards or downwards very quickly—easily hundreds of volts per nano-second. All of these elements make it very difficult for a decision making circuit to make and hold the last state reliably and repeatedly.

A second part 202 of the circuit of FIG. 14, is a negative pulse detector circuit, which uses capacitive coupling to convert a negative polarity pulse from the transformer into a logic signal to cause the transistor being controlled by the high side drive circuit to be turned off. The advantage of using capacitive coupling is that it is quick allowing for a fast time of response. It also allows for the use of a negative input to a unipolar circuit operating between ground S and the voltage rail $V_{sec}$.

The operation of this part 202 of the circuit will now be explained.

The output from the transformer is fed through capacitor C5 to an input node of the second part of the circuit. Initially, it may be taken that the voltage at this node is biased at a voltage corresponding to the voltage derived from the resistor divider R0 and R2, namely at a voltage of $V_{sec}R2/(R2+R0)$. At the same time, the single stage amplifier provided by the combination of the three transistors M2, M3 and M8 has its input trip point skewed towards ground. This is in contrast to a normal amplifier configuration which would omit transistor M2, where the trip point would be ~Vsec/2. Thus the trip point is positioned at a point between $V_{sec}/2$ and ground.

At the same time R0 and R2 bias the input to Vsec/2 meaning that the output of this amplifier is nominally at 0V (Low). The subsequent combination of M7 and M11 act as a first inverter converting the Low signal to a High. The subsequent combination of M13 and M12 act a second inverter converting this High to a Low. It will thus be appreciated that the first and second inverters co-operate to act a buffer for the amplifier provided by the arrangement of M2, M3 and M8.

With the trip point positioned at a point between $V_{sec}/2$ and ground, it is evident that the only way to change the state of the amplifier is to pull the input a margin below Vsec/2.

The capacitors C5 and C9 provide a path for a voltage at TXS+ to be capacitively coupled onto the input of the inverter. An advantage of capacitively coupling the pulse signal here is that there is a relatively low latency, i.e. no significant time delay in delivering the pulse to the input of the amplifier. In contrast, resistive coupling would be slower.

Additionally, the use of resistive coupling would present problems for common mode dv/dt immunity.

As long as there is no voltage excursion at TXS+ the inverter chain will not change state. Only a negative going voltage pulse on TXS+ will force a change of state in the single stage amplifier and subsequently through the downstream inverters and into the memory cell forcing an off signal at the output of the drive circuit. Once that negative voltage pulse on TXS+ has returned to 0V the amplifier output returns to its resting state (inverting) and the self-biased memory cell holds the off state.

The arrival of a negative pulse is passed through capacitor C5 and causes the voltage at the node between resistors R0 and R2 to be pulled down closer to the voltage of the ground rail S which in turn causes the output of the amplifier provided by the transistor combination of M2, M3, M8 to switch high. This high is transferred through the buffer (combination of transistors M7, M11 and M13, M12) to the output of this part of the circuit. After the negative pulse has been delivered, it will be appreciated that the circuit will revert to the original state.

The output 202 from the second part of the circuit is provided to a first clamping circuit 204. The first clamping circuit acts to clamp the switch being controlled across outputs OUTPD and OUTSS. Specifically, a transistor M25 is switchably connected across the outputs OUTPD and OUTSS. The output from the second part of the circuit 202 is provided as an input to this transistor. The arrival of a negative pulse at the input to the second part of the circuit results in a high pulse being provided to the transistor causing it to turn on and thus clamping the outputs OUTPD and OUTSS effectively turning off an external transistor connected thereto.

The resistor-capacitor combination R17-C8 provides for a time constant to ensure that the external switch is turned off whilst at the same time allowing for the action of the clamping circuit 204 to stop after a predefined time.

A resistor R16 is provided across the output nodes to reduce the risk of accidental switching by noise. The capacitors C5 and C9 provide a path for the voltage at TXS+ to be capacitively coupled onto the input of the inverter.

If the single stage amplifier provided by M2, M3, M8 is in its normal resting state, a positive going voltage pulse on TXS+ will not change the state of the single stage amplifier.

An advantage of using the capacitors C5 and C9 is that it provides for high dv/dt immunity, also known as common mode transient immunity. More specifically, the capacitors C5 and C9 are selected so that they tend to swamp out the parasitic capacitances of the switches in the decision making circuit.

It will be appreciated that the exact values selected for the transistors will depend on the transistors employed but generally speaking a value of 10 pF for each of C5 and C9 have proven effective generally.

Given that C5 and C9 are the same, or similar values, the natural bias point of the single stage amplifier, naturally inverting, remains at Vsec/2 just as is programmed by the two resistors R0 and R2. So, regardless of the dv/dt common-mode change on the floating die the balanced structure of the DC resistive elements and the AC capacitive elements will ensure a solid and reliable state at the output of the floating drive circuit secondary die. Thus it will be appreciated that the second aspect of the circuit provides a number of advantages including for example:

Capacitive coupling guarantees fast delivery of the Vdrv pulses onto the input of the first inverter.

Enables state change in output drive circuit using bipolar voltages.

Guarantees robust state under very fast dv/dt conditions of floating die in drive circuit application.

Naturally balanced system both for both AC and DC states.

A further aspect of the circuit 203 provides a second clamp which responds to a memory cell which in turn is used to latch the last state (ON/OFF) of a received pulse. The memory cell is self-biased and thus not reliant on the presence of the secondary rail voltage $V_{sec}$. As a result, the second clamp operates to reduce the possibility of the external transistor accidentally being turned on as a result of common mode noise, switching artefacts or other noise. At the same time, it allows for the state of the outputs to be maintained for a relatively long duration between switching (ON/OFF) pulses.

The exemplary circuit employs a SR flip-flop as a memory cell. As explained above, the flip-flop is self-biased and does not require a separate voltage supply to function as a flip-flop. This flip-flop receives its set Set-Reset inputs (which also inherently provide power) through diodes D9 and D10.

Switches M23 and M24 and capacitors C7 and C10 act as the flip-flop. The delivery of an off pulse onto the anode of D10 will force M24 on and M23 off. This state is maintained by capacitors C7 and C10. Similarly the delivery of an on pulse to the transformer outputs TXS+ and TXS− will cause a pulse to be delivered through D9 to turn on M23 and M24 off. The output of the flip flop in turn is used to control switch M20 which in turn is connected across the output nodes OUTPD and OUTSS and thus acts as a second clamp across the output.

Thus a negative pulse arriving at the transformer winding to the second part of the circuit 202 will cause a pulse to be delivered through diode D10 causing the flip-flop to set switch M20 on. In contrast, a positive pulse arriving will be delivered through diode D9 and trigger the flip-flop to set switch M20 off.

The advantage here is that an un-powered flip-flop will hold its state, either on or off, without the application of a voltage supply making it ideal for use in a floating drive circuit application where there may not be any voltage supply for long time durations, for example where pulse skipping or other control techniques are employed.

The delivery of narrow pulses changes the state of the unpowered, self-biased, memory cell which will hold its state for long durations. In the context of the present application, a long duration may be considered as generally greater than 100 mSec.

It will be appreciated that advantages of using a memory cell, as for example described, is that:

It is a self-biased memory cell—no need for another winding or power supply.

Pulses of short duration to set required state saving energy and allowing smaller transformers.

It is useful for floating die in drive circuit applications.

It provides for long ON and OFF durations without frequent energy refreshing to the floating die.

Low Latency Cap Coupled Drive

A further aspect of the present application will now be described.

In a floating drive circuit there is the need to drive the primary switch (or switches) to deliver energy to the secondary floating die. These switches may be high-side as in the case of, but not limited to, a full-bridge converter. Ground reference pre-drive of high-side switches can be power inefficient and have long time latency. It is advantageous to have low latency drive and not to add propagation delay unnecessarily through the system. The present application seeks to use a low voltage drive signal, suitably less than 5V (e.g. 3V3 drives or less) in contrast to the more commonly employed voltages of 12 Volts or more. Using low voltage transistors reduces delay. The approach used generally is to drive the primary side PMOS's in the full-bridge (FB) using capacitor coupled, low voltage pre-drives, e.g. 3V3 drives. However capacitively coupling a square wave with a variable duty cycle will mean charging/discharging the coupling capacitor.

Figure 17:
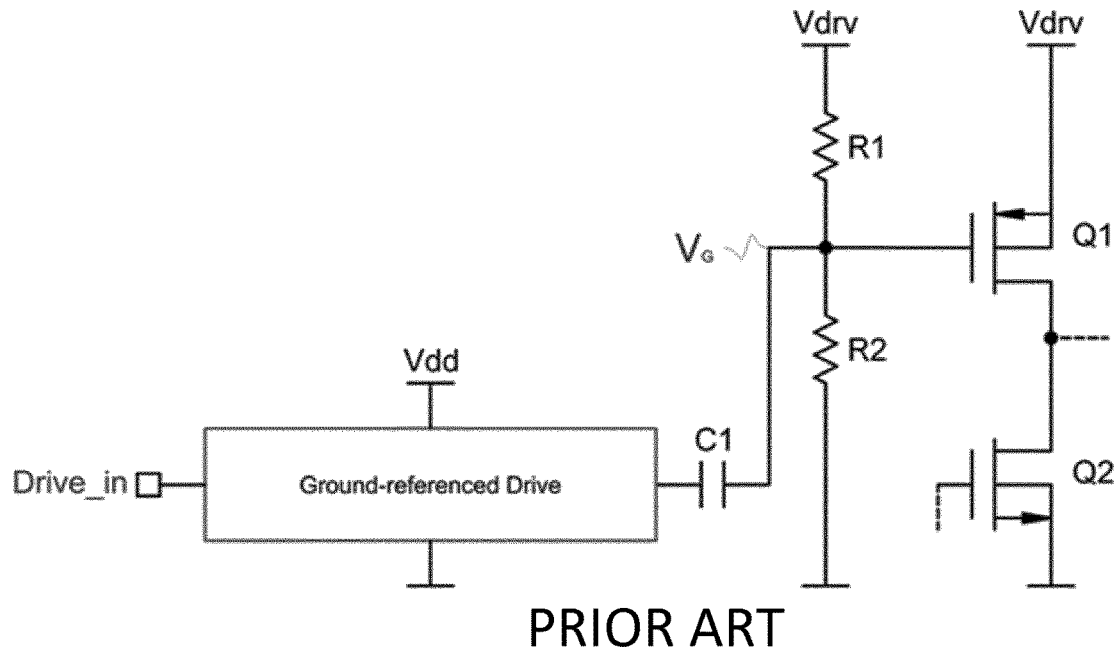
FIG. 17 is a known prior art approach to driving a switch on a primary side.

Unfortunately, a side effect of using capacitive coupling is that the common-mode (CM) voltage point after the capacitor will shift up and down as the duty cycle varies. It will be appreciated that this makes it difficult to use for driving MOS switches. FIG. 17 shows a standard capacitive coupling scheme which suffers from the problem just described. More specifically, FIG. 17 represents a conventional capacitive coupled drive with ground referenced drive circuit. In FIG. 17, the ground referenced drive circuit drives Q1 through C1 with Vbias created by R1 and R2. As the duty cycle increases then the voltage min and max on the gate of Q1 will reduce due to the charging of C1.

Figure 18:
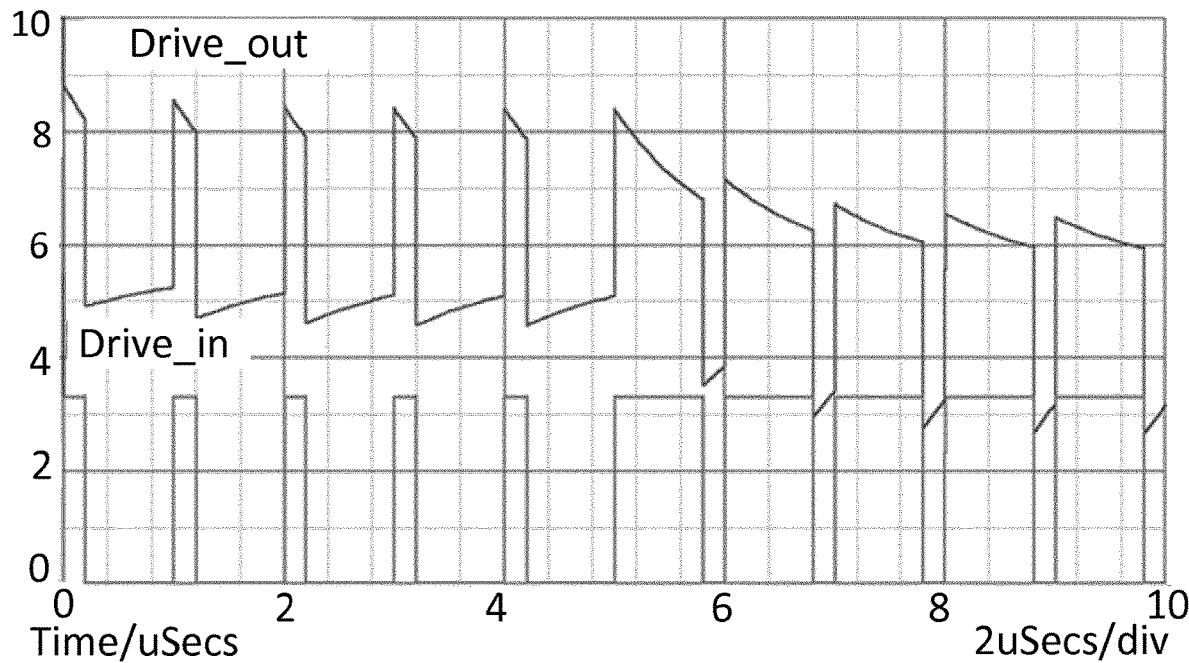
FIG. 18 is a timing diagram illustrating a problem of how a change in pulse width can affect the drive signal applied to the transistor Q1 in FIG. 17.

The problem is illustrated in the timing diagram of FIG. 18, in which the input drive signal Drive_In is represented in the lower trace with the voltage $V_G$ at the output of the capacitor at the node between R1 and R2 represented by the upper trace. As may be seen roughly half way across, when the duty cycle of the Drive_in signal changes the voltage at the node also shifts.

Similarly, reducing duty cycle will increase the min and max voltage levels on the gate of Q1. If Q1 is a PMOS then this movement in drive voltage levels with duty cycle variation makes it very difficult, if not impossible, to manage the Q1 drive appropriately. If it is assumed $V_{thp}$ of Q1 is 1V then the 3.3V drive needs to be appropriately biased around this threshold to correctly switch the device. One solution is to use a direct resistive coupling between the drive and transistors, however this introduces the problem of latency.

A further aspect of the present application provides a solution, which will now be discussed with reference to FIGS. 19 and 20.

More specifically, the present application introduces a bias management circuit into a capacitively coupled drive circuit. The bias management circuit introduces a voltage bias into the circuit after the capacitor to counter against a shift in the voltage at this point from varying duty cycle of the input drive signal. Thus the Bias management circuit counteracts any shift in the common mode voltage at the gate of transistor Q1 arising from different duty cycle signals being presented across the capacitor C1. Thus, using a suitable bias management circuit to provide a bias to the gate of transistor Q1 (pmos), the transistor Q1 can respond as required to switching signals delivered through the capacitor even as the duty cycle presented moves across the range, for example from 0% to 100%.

Figure 20:
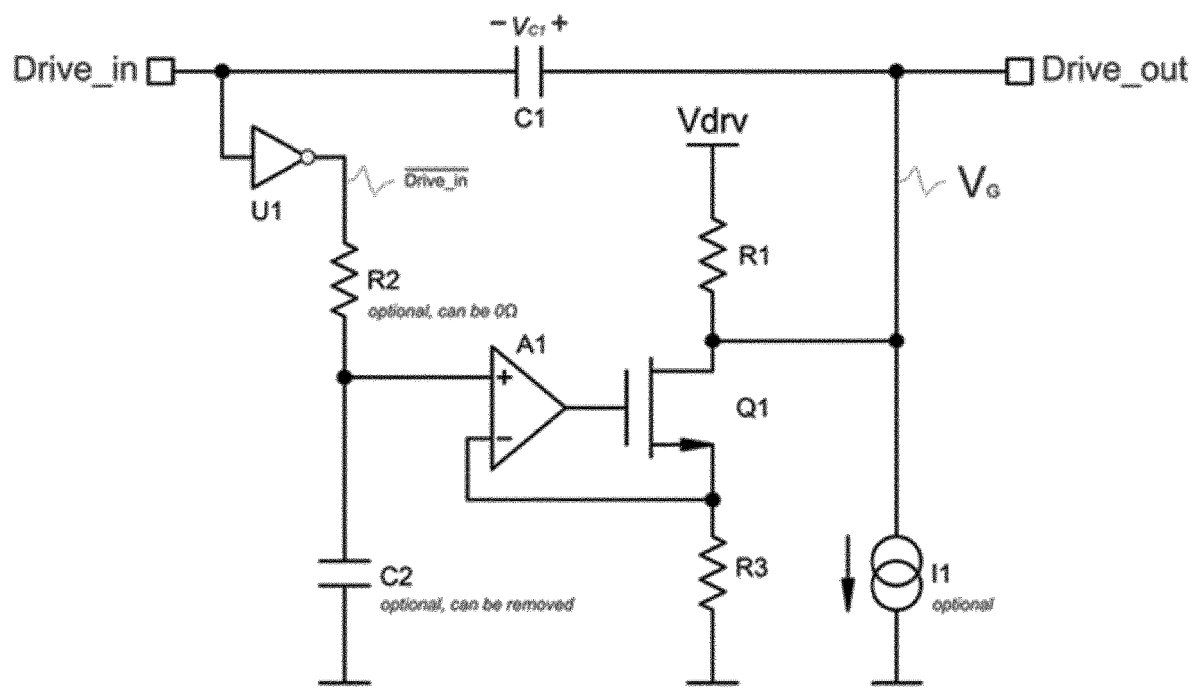
FIG. 20 is a circuit suitable for use in the arrangement of FIG. 19.

An exemplary implementation of a bias management circuit is illustrated in FIG. 20, which employs a feed-forward mechanism that monitors the input duty-cycle. Based on the monitored value of the input duty cycle, the feed forward mechanism modifies the bias voltage Vg at the gate of the transistor Q1 so as to maintain the voltage levels across the desired duty-cycle range. This ensures optimum drive at all times for Q1.

Figure 19:
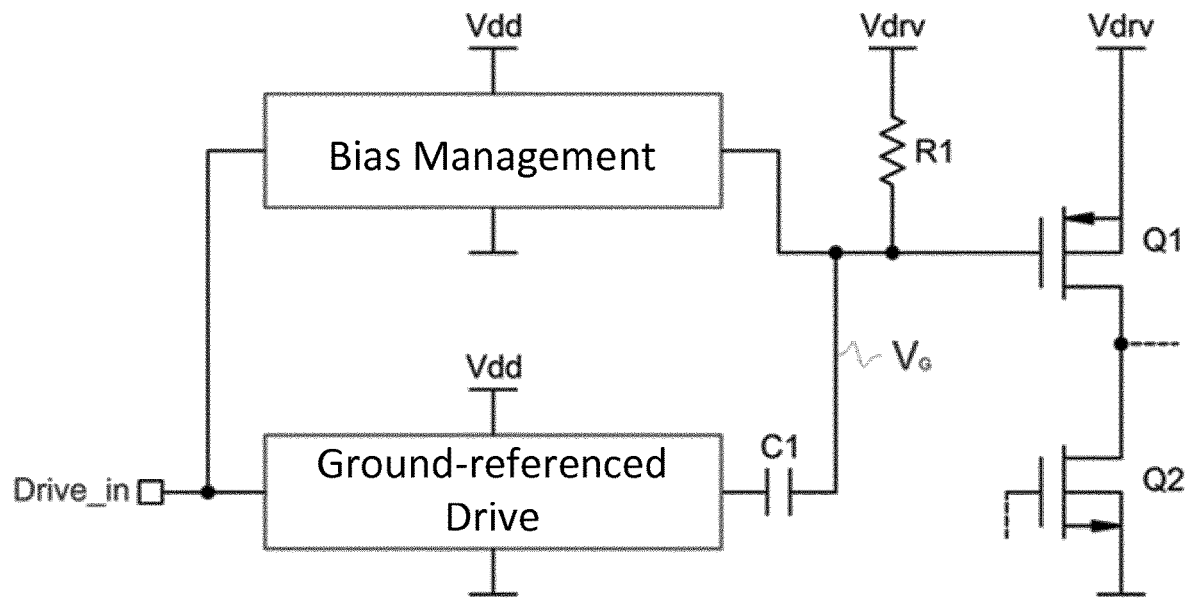
FIG. 19 is a circuit which may be used in place of the arrangement of FIG. 17 and which reduces the problem associated with changing pulse widths.

In FIG. 20 the main path, input to output, is from Drive_in through C1 to Drive_out pin, which in FIG. 19 would be connected to the gate of Q1.

The intended operation is to use a logic-level input drive signal (Drive_in, e.g. 3.3V ground referenced signal) to drive a high-side PMOS using gate drive signal Drive_out. The source of the PMOS is connected to Vdrv (e.g. 12V). The goal is to ensure that $V_{Gmax}$ and $V_{Gmin}$ remain approximately constant versus variations of duty cycle on Drive_in.

The time-average current through R3 is $$IR3 = (1-d) \cdot \frac{Vdd}{R3}$$

Then the average voltage across R1, with bias current I1 is $$VR1 = (1-d) \cdot Vdd \cdot \frac{R1}{R3} + I1 \cdot R1$$

For simplicity, assume R1=R3 then $$VG = Vdrv - VR1 = Vdrv - Vdd + dVdd - I1 \cdot R1$$

The average voltage across coupling capacitor VC1 is thus $$VC1 = VG - d \cdot Vdd = Vdrv - Vdd - I1 \cdot R1$$

So, from the above equation we see that the average voltage present across C1 is duty-cycle independent.

The maximum voltage level on Vg is thus $$VGmax = Vdd + VC1 = Vdrv - I \cdot R1$$

And the minimum voltage level on Vg is $$VGmin = VGmax - Vdd$$

The bias current I1 may be zero in which case $$VGmax = Vdrv$$

In reality a small bias current may be useful to set VGmax slightly below Vdrv. Better still, I1 may be an inverse-PTAT to account for the negative TC of Vth of the PMOS switch.

Figure 21:
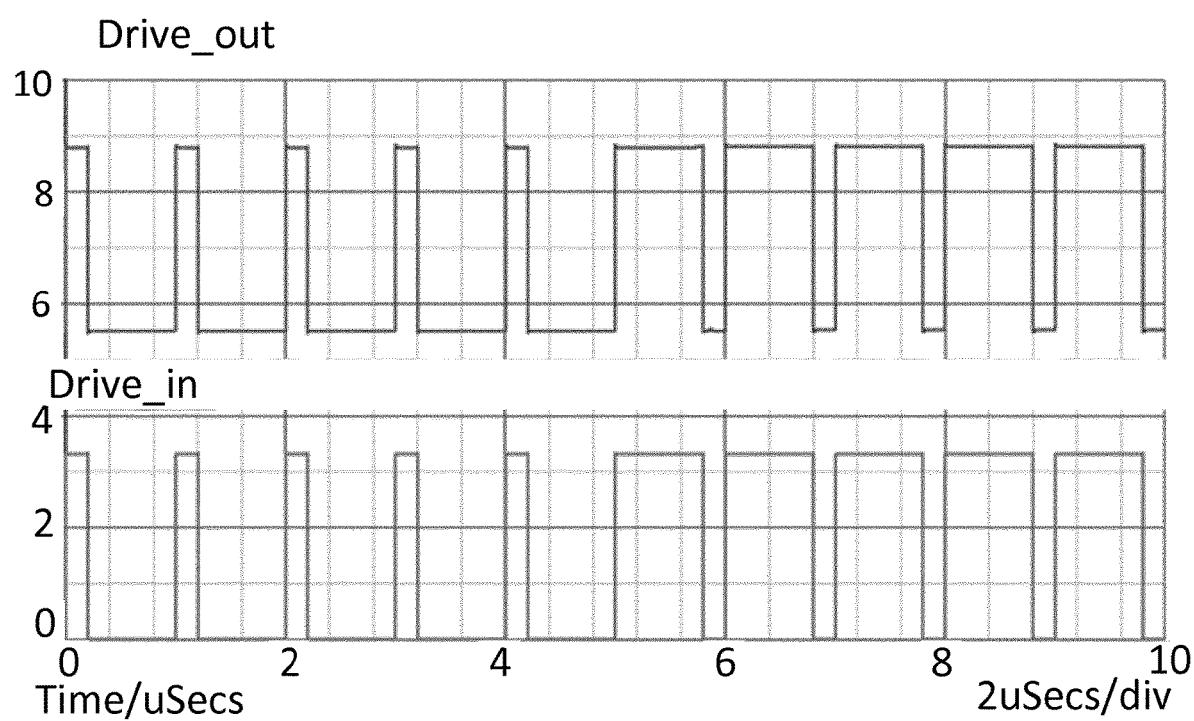
FIG. 21 is a timing diagram for the circuit of FIG. 20.

FIG. 21 shows the resulting circuit waveforms for a step change in duty cycle from d=20% to 80% at t=5 us. We see that even for a large instantaneous step in duty cycle the voltage levels on the Drive_out pin follow the input from Drive_in without any short or long term shift in the high and low voltage levels in complete contrast to the waveforms of FIG. 18, which it will be appreciated is due to the compensation of the feed-forward mechanism.

The advantages of the use of the bias management mechanism include for example:

Fast propagation from low voltage ground referenced signal to high voltage drive.
Automatic maintenance of low and high voltage levels at circuit output across full duty-cycle range.
Negligible duty-cycle distortion.
Lower power consumption due to use of low voltage devices for high voltage drive.

The drive circuit invention described here is applicable to, but not limited to, synchronous rectifier applications crossing voltage isolation boundaries, driving active clamp switches, two switched forward converters, half-bridge and full-bridge converters, Bridgeless PFC and CUK converters. The drive circuit invention is also applicable to, but not limited to MOS and GaN FET's and IGBT's.

Whilst, the foregoing description has been described in the context of a single module incorporating a first integrated circuit (Die 1) a transformer and a second integrated circuit (Die 2), it will be appreciated that each may be provided as a discrete component. Accordingly, the present application is to be taken to include one of the first or second integrated circuits in isolation from the other and the transformer.

In the foregoing specification, the application has been described with reference to specific examples of embodiments. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Because the apparatus implementing the present application is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention. It will be understood that whilst particular polarity devices, e.g. PMOS, NMOS, PNP or NPN may be illustrated in the figures, that alternative polarity devices may be employed by appropriate modification of the circuits.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments. Equally, whilst the claims are directed to an isolated gate drive or reset circuit for same, the application is not to be construed as being so limited and extends to a method for doing same. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An isolated high side drive circuit for providing a drive signal to a semiconductor switch, the high side drive circuit comprising:
   a transformer having a primary winding and a secondary winding, the secondary winding being a single winding defined between two nodes;
   a primary side circuit comprising a plurality of switches arranged in a bridge configuration with the primary winding positioned within the bridge configuration and a control circuit for controlling the switches in response to an input signal; and
   a secondary side circuit connected to the two nodes of the secondary winding of the transformer and having a drive circuit output for providing a drive signal to the semiconductor switch, wherein the control circuit is configured to operate the switches in a first mode to effect the delivery of a drive pulse of a first polarity and in a second mode to effect the delivery of a pulse with an opposite second polarity to a primary winding of the transformer, wherein the secondary side circuit is configured to respond to a first polarity pulse to effect a turn on the semiconductor switch and wherein the secondary side circuit is configured to respond to a second polarity pulse to effect a turning off of the semiconductor switch and wherein the pulses of the first or second polarity are employed to power an internal power rail of the secondary side circuit, wherein the secondary side circuit further comprises a memory circuit for storing the polarity of a last received pulse in the event the voltage on the power rail collapses, wherein in a start-up mode the control circuit is configured to provide a plurality of pulses of the second polarity prior to sending a first pulse of the first polarity, and wherein the secondary side circuit comprises a charge pump circuit for powering the internal power rail using pulses of the second polarity,
   wherein the charge pump circuit comprises:
   a first capacitor having first and second plates, the first plate connected to an input from a first side of the secondary winding of the transformer; and
   a diode connected between the second side of secondary winding of the transformer and a second plate of the first capacitor, wherein a connection is provided from the second plate of the first capacitor through a third diode to the internal power rail.

2. The isolated high side drive circuit of claim 1, wherein the memory circuit comprises a self-biased flip flop.

3. The isolated high side drive circuit of claim 2, wherein the self-biased flip flop comprises first and second switches, each switch being connected to respective first and second capacitors for holding the polarity of the last received pulse.

4. The isolated high side drive circuit of claim 1, wherein the plurality of switches of the primary side circuit includes four switches and the bridge configuration is a full bridge, wherein the control circuit is configured to operate in a third mode, where no voltage is presented to the primary winding and wherein the control circuit comprises a detector for detecting the arrival of a PWM input signal, wherein the control circuit is configured to select the first mode of operation for a predetermined period and thereafter to select the third mode.

5. The isolated high side drive circuit of claim 4, wherein the predetermined period is selected to be shorter than the expected minimum duration of a PWM pulse.

6. The isolated high side drive circuit of claim 4, wherein the control circuit is configured to detect the end of the PWM pulse and in response thereto to select the second mode.

7. An isolated high side drive circuit for providing a drive signal to a semiconductor switch, the high side drive circuit comprising:
a transformer having a primary winding and a secondary winding, the secondary winding being a single winding defined between two nodes;
a primary side circuit comprising a plurality of switches arranged in a bridge configuration with the primary winding positioned within the bridge configuration and a control circuit for controlling the switches in response to an input signal; and
a secondary side circuit connected to the two nodes of the secondary winding of the transformer and having a drive circuit output for providing a drive signal to the semiconductor switch, wherein the control circuit is configured to operate the switches in a first mode to effect the delivery of a drive pulse of a first polarity and in a second mode to effect the delivery of a pulse with an opposite second polarity to a primary winding of the transformer, wherein the secondary side circuit is configured to respond to a first polarity pulse to effect a turn on the semiconductor switch and wherein the secondary side circuit is configured to respond to a second polarity pulse to effect a turning off of the semiconductor switch and wherein the pulses of the first or second polarity are employed to power an internal power rail of the secondary side circuit, wherein the secondary side circuit further comprises a memory circuit for storing the polarity of a last received pulse in the event the voltage on the power rail collapses, wherein the memory circuit comprises a self-biased flip flop, wherein the self-biased flip flop comprises first and second switches, each switch being connected to respective first and second capacitors for holding the polarity of the last received pulse, wherein a first diode is connected between a negative pulse detector circuit and the first switch, and wherein a second diode is connected between the secondary winding and the second switch.

8. The isolated high side drive circuit of claim 7, wherein in a start-up mode the control circuit is configured to provide a plurality of pulses of the second polarity prior to sending a first pulse of the first polarity.

9. The isolated high side drive circuit of claim 8, characterized in that the secondary side circuit comprises a charge pump circuit for powering the internal power rail using pulses of the second polarity.

10. The isolated high side drive circuit of claim 9, wherein the charge pump circuit is configured to convert a pulse of the second polarity to a voltage of the first polarity.

11. An isolated high side drive circuit for providing a drive signal to a semiconductor switch, the high side drive circuit comprising:
a transformer having a primary winding and a secondary winding, the secondary winding being a single winding defined between two nodes;
a primary side circuit comprising a plurality of switches arranged in a bridge configuration with the primary winding positioned within the bridge configuration and a control circuit for controlling the switches in response to an input signal; and
a secondary side circuit connected to the two nodes of the secondary winding of the transformer and having a drive circuit output for providing a drive signal to the semiconductor switch, wherein the control circuit is configured to operate the switches in a first mode to effect the delivery of a drive pulse of a first polarity and in a second mode to effect the delivery of a pulse with an opposite second polarity to a primary winding of the transformer, wherein the secondary side circuit is configured to respond to a first polarity pulse to effect a turn on the semiconductor switch and wherein the secondary side circuit is configured to respond to a second polarity pulse to effect a turning off of the semiconductor switch and wherein the pulses of the first or second polarity are employed to power an internal power rail of the secondary side circuit, wherein the secondary side circuit further comprises a memory circuit for storing the polarity of a last received pulse in the event the voltage on the power rail collapses, wherein the memory circuit comprises a self-biased flip flop, wherein the self-biased flip flop comprises first and second switches, each switch being connected to respective first and second capacitors for holding the polarity of the last received pulse, wherein the first and second switches of the self-biased flip flop are MOSFETs and the drain of the first MOSFET switch is connected to the gate of the second switch and wherein the drain of the second MOSFET switch is connected to the gate of the first MOSFET switch, and wherein each of first and second capacitor is connected between drain and source of the respective first and second MOSFET switches.

12. An isolated high side drive circuit for providing a drive signal to a semiconductor switch, the high side drive circuit comprising:
a transformer having a primary winding and a secondary winding, the secondary winding being a single winding defined between two nodes;
a primary side circuit comprising a plurality of switches arranged in a bridge configuration with the primary winding positioned within the bridge configuration and a control circuit for controlling the switches in response to an input signal; and
a secondary side circuit connected to the two nodes of the secondary winding of the transformer and having a drive circuit output for providing a drive signal to the semiconductor switch, wherein the control circuit is configured to operate the switches in a first mode to effect the delivery of a drive pulse of a first polarity and in a second mode to effect the delivery of a pulse with an opposite second polarity to a primary winding of the transformer, wherein the secondary side circuit is configured to respond to a first polarity pulse to effect a turn on the semiconductor switch and wherein the secondary side circuit is configured to respond to a second polarity pulse to effect a turning off of the semiconductor switch and wherein the pulses of the first or second polarity are employed to power an internal power rail of the secondary side circuit, wherein the secondary side circuit further comprises a memory circuit for storing the polarity of a last received pulse in the event the voltage on the power rail collapses, wherein the plurality of switches of the primary side circuit includes four switches and the bridge configuration is a full bridge, wherein the control circuit is configured to operate in a third mode, where no voltage is presented to the primary winding and wherein the control circuit comprises a detector for detecting the arrival of a PWM input signal, wherein the control circuit is configured to select the first mode of operation for a predetermined period and thereafter to select the third mode, and wherein the control circuit is configured to operate in a fourth mode in which one or more pulses of the first polarity are presented as trickle pulses, where the voltage of trickle pulses are less than those of drive pulses.

13. The isolated high side drive circuit of claim 12, wherein the control circuit is configured to select the fourth mode after the arrival of a PWM pulse and after the selection of the third mode but before the end of the PWM pulse.

* * * * *